(12) United States Patent
Duan et al.

(10) Patent No.: US 9,496,879 B1
(45) Date of Patent: Nov. 15, 2016

(54) MULTIPHASE CLOCK DATA RECOVERY FOR A 3-PHASE INTERFACE

(71) Applicant: QUALCOMM Incorporated, San Diego, CA (US)

(72) Inventors: Ying Duan, San Diego, CA (US); Chulkyu Lee, San Diego, CA (US); Shih-Wei Chou, San Diego, CA (US); Harry Dang, San Diego, CA (US); Ohjoon Kwon, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/842,644

(22) Filed: Sep. 1, 2015

(51) Int. Cl.
*H03D 3/24* (2006.01)
*H03L 7/08* (2006.01)
*H03L 7/081* (2006.01)
*H04L 7/00* (2006.01)
*H04L 7/033* (2006.01)

(52) U.S. Cl.
CPC ........... *H03L 7/0807* (2013.01); *H03L 7/0812* (2013.01); *H04L 7/0037* (2013.01); *H04L 7/0087* (2013.01); *H04L 7/0331* (2013.01)

(58) Field of Classification Search
CPC .................................................... H04L 7/0008
USPC ........................................................ 375/376
See application file for complete search history.

(56) References Cited

U.S. PATENT DOCUMENTS

| | | | |
|---|---|---|---|
| 5,771,264 A * | 6/1998 | Lane | H03L 7/181 327/158 |
| 7,742,551 B2 | 6/2010 | Pyeon | |
| 7,826,279 B2 | 11/2010 | Searles et al. | |
| 8,650,429 B1 | 2/2014 | Starr et al. | |
| 8,983,409 B2 | 3/2015 | Ngo et al. | |
| 2003/0141910 A1* | 7/2003 | Reindl | H03L 7/0812 327/158 |
| 2009/0153205 A1* | 6/2009 | Johnson | H03L 7/0812 327/158 |
| 2013/0241759 A1* | 9/2013 | Wiley | H04L 25/0272 341/173 |
| 2015/0030112 A1 | 1/2015 | Wiley et al. | |

* cited by examiner

*Primary Examiner* — Lihong Yu
(74) *Attorney, Agent, or Firm* — Loza & Loza, LLP

(57) ABSTRACT

Methods, apparatus, and systems for data communication over a multi-wire, multi-phase interface are disclosed. A method of data communication includes configuring a clock recovery circuit to provide a first clock signal that includes a pulse for each symbol transmitted on the interface, where symbols are transmitted on the interface at a first frequency, adjusting a loop delay of the clock recovery circuit to modify the first clock to have a second frequency that is no more than half the first frequency, where the clock recovery circuit generates a pulse in the first clock signal for a first of an integer number of symbols and suppresses pulse generation for other symbols in the integer number of symbols, configuring a clock generation circuit to provide a second clock signal, and capturing symbols from the interface using the first clock signal and the second clock signal.

25 Claims, 21 Drawing Sheets

MULTIPHASE CLOCK DATA RECOVERY FOR A 3-PHASE INTERFACE

TECHNICAL FIELD

The present disclosure relates generally to high-speed data communications interfaces, and more particularly, to clock generation in a receiver coupled to a multi-wire, multi-phase data communication link.

BACKGROUND

Manufacturers of mobile devices, such as cellular phones, may obtain components of the mobile devices from various sources, including different manufacturers. For example, an application processor in a cellular phone may be obtained from a first manufacturer, while an imaging device or camera may be obtained from a second manufacturer, and a display may be obtained from a third manufacturer. The application processor, the imaging device, the display controller, or other types of device may be interconnected using a standards-based or proprietary physical interface. In one example, an imaging device may be connected using the Camera Serial Interface (CSI) defined by the Mobile Industry Processor Interface (MIPI) Alliance. In another example, a display may include an interface that conforms to the Display Serial Interface (DSI) standard specified by the Mobile Industry Processor Interface (MIPI) Alliance A multiphase three-wire (C-PHY) interface defined by the MIPI Alliance uses a trio of conductors to transmit information between devices. Each of the three wires may be in one of three signaling states during transmission of a symbol over the C-PHY interface. Clock information is encoded in a sequence of symbols transmitted on the C-PHY interface and a receiver generates a clock signal from transitions between consecutive symbols. The maximum speed of the C-PHY interface and the ability of a clock and data recovery (CDR) circuit to recover clock information may be limited by the maximum time variation related to transitions of signals transmitted on the different wires of the communication link. A receiver may employ delay circuits to ensure that all of the conductors in the trio have assumed a stable signaling state before providing a sampling edge. The transmission rate of the link may be limited by the delay values used, and there is an ongoing need for clock generation circuits that can function reliably as signaling frequencies of multi-wire interfaces increase.

SUMMARY

Embodiments disclosed herein provide systems, methods and apparatus that enable improved communications on a multi-wire and/or multiphase communications link. The communications link may be deployed in apparatus such as a mobile terminal having multiple Integrated Circuit (IC) devices.

In an aspect of the disclosure, a method of data communication includes configuring a clock recovery circuit to provide a first clock signal that includes a pulse for each symbol transmitted on a 3-wire, 3-phase interface, where symbols are transmitted on the 3-wire, 3-phase interface at a first frequency, adjusting a loop delay of the clock recovery circuit to modify the first clock to have a second frequency that is no more than half the first frequency, where the clock recovery circuit generates a pulse in the first clock signal for a first of an integer number of symbols and suppresses pulse generation for other symbols in the integer number of symbols, configuring a clock generation circuit to provide a second clock signal, where the second clock signal includes pulses for each of the other symbols in the integer number of symbols, and capturing symbols from the 3-wire, 3-phase interface using the first clock signal and the second clock signal.

In an aspect of the disclosure, an apparatus for decoding data transmitted on a 3-wire 3-phase interface includes means for configuring a clock recovery circuit to provide a first clock signal that includes a pulse for each symbol transmitted at a first frequency on a 3-wire, 3-phase interface, means for calibrating a loop delay of the clock recovery circuit. In one mode of operation, the means for calibrating the loop delay modifies the first clock signal to have a second frequency that is no more than half the first frequency. In the first mode of operation the clock recovery circuit generates a pulse in the first clock signal for a first of an integer number of symbols and suppresses pulse generation for other symbols in the integer number of symbols, means for configuring a clock generation circuit to provide a second clock signal, where the second clock signal includes pulses for each of the other symbols in the integer number of symbols. The apparatus may also include means for capturing symbols from the 3-wire, 3-phase interface using the first clock signal and the second clock signal.

In an aspect of the disclosure, an apparatus for data communication includes a plurality of difference receivers coupled to a 3-wire bus, a clock recovery circuit configured to provide a first clock signal that includes a pulse for each symbol transmitted in a stream of symbols at a first frequency on a 3-wire, 3-phase interface, one or more registers, and a processing circuit. The processing circuit may be configured to adjust a loop delay of the clock recovery circuit until the first clock is modified to have a second frequency that is no more than half the first frequency, where the clock recovery circuit generates a pulse in the first clock signal for a first of an integer number of the stream of symbols and suppresses pulse generation for other symbols in the integer number of the stream of symbols, and configure a clock generation circuit to provide a second clock signal, where the second clock signal includes pulses for each of the other symbols in the integer number of symbols. The one or more registers may capture symbols from the 3-wire, 3-phase interface in response to pulses in the first clock signal and the second clock signal.

In an aspect of the disclosure, a processor readable storage medium is disclosed. The storage medium may be a non-transitory storage medium and may store code that, when executed by one or more processors, causes the one or more processors to configure a clock recovery circuit to provide a first clock signal that includes a pulse for each symbol transmitted on a 3-wire, 3-phase interface, where symbols are transmitted on the 3-wire, 3-phase interface at a first frequency, adjust a loop delay of the clock recovery circuit such that the first clock has a second frequency that is no more than half the first frequency, where the clock recovery circuit generates a pulse in the first clock signal for a first of an integer number of symbols and suppresses pulse generation for other symbols in the integer number of symbols, configure a clock generation circuit to provide a second clock signal, where the second clock signal includes pulses for each of the other symbols in the integer number of symbols, and capture symbols from the 3-wire, 3-phase interface using the first clock signal and the second clock signal.

DETAILED DESCRIPTION

Figure 1:
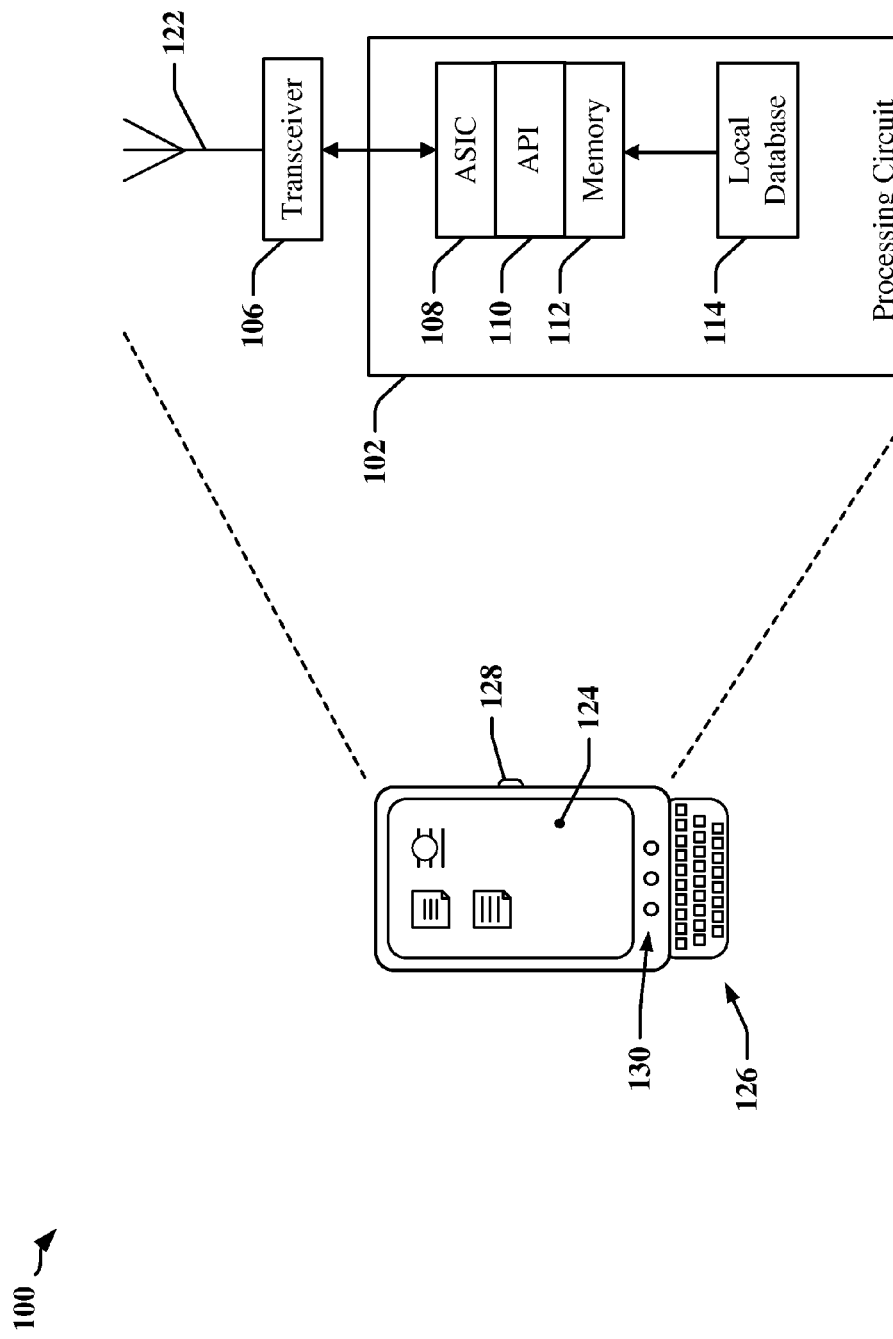
FIG. 1 depicts an apparatus employing a data link between IC devices that selectively operates according to one of plurality of available standards.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Overview

Certain aspects of the invention may be applicable to a C-PHY interface specified by the MIPI Alliance, which may be deployed to connect electronic devices that are subcomponents of a mobile apparatus such as a telephone, a mobile computing device, an appliance, automobile electronics, avionics systems, etc. Examples of a mobile apparatus include a cellular phone, a smart phone, a session initiation protocol (SIP) phone, a laptop, a notebook, a netbook, a smartbook, a personal digital assistant (PDA), a satellite radio, a global positioning system (GPS) device, a multimedia device, a video device, a digital audio player (e.g., MP3 player), a camera, a game console, a wearable computing device (e.g., a smartwatch, a health or fitness tracker, etc.), an appliance, a sensor, a vending machine, or any other similarly functioning device.

The C-PHY interface is a high-speed serial interface that can provide high throughput over bandwidth-limited channels. The C-PHY interface may be deployed to connect application processors to peripherals, including displays and cameras. The C-PHY interface encodes data into symbols that are transmitted in a three-phase signal over a set of three wires, which may be referred to as a trio, or trio of wires. The three-phase signal is transmitted on each wire of the trio in different phases. Each three-wire trio provides a lane on a communications link. A symbol interval may be defined as the interval of time in which a single symbol controls the signaling state of a trio. In each symbol interval, one wire is "undriven" while the remaining two of the three wires are differentially driven such that one of the two differentially driven wires assumes a first voltage level and the other differentially driven wire assumes to a second voltage level different from the first voltage level. The undriven wire may float, be driven, and/or be terminated such that it assumes a third voltage level that is at or near the mid-level voltage between the first and second voltage levels. In one example, the driven voltage levels may be +V and −V with the undriven voltage being 0 V. In another example, the driven voltage levels may be +V and 0 V with the undriven voltage being +V/2. Different symbols are transmitted in each consecutively transmitted pair of symbols, and different pairs of wires may be differentially driven in different symbol intervals.

FIG. 1 depicts an example of apparatus 100 that may employ a C-PHY 3-phase communication link. The apparatus 100 may include a wireless communication device that communicates through a radio frequency (RF) communications transceiver 106 with a radio access network (RAN), a core access network, the Internet and/or another network. The communications transceiver 106 may be operably coupled to a processing circuit 102. The processing circuit 102 may include one or more IC devices, such as an application-specific IC (ASIC) 108. The ASIC 108 may include one or more processing devices, logic circuits, and so on. The processing circuit 102 may include and/or be coupled to processor readable storage such as memory devices 112 that may include processor-readable devices that store and maintain data and instructions for execution or for other use by the processing circuit 102 and devices, and/or memory cards that support a display 124. The processing circuit 102 may be controlled by one or more of an operating system and an application programming interface (API) 110 layer that supports and enables execution of software modules residing in storage media, such as the memory device 112 of the wireless device. The memory devices 112 may include read-only memory (ROM), dynamic random-access memory (DRAM), one or more types of programmable read-only memory (PROM), flash cards, or any memory type that can be used in processing systems and computing platforms. The processing circuit 102 may include or access a local database 114 that can maintain operational parameters and other information used to configure and operate the apparatus 100. The local database 114 may be implemented using one or more of a database module, flash memory, magnetic media, electrically-erasable PROM (EEPROM), optical media, tape, soft or hard disk, or the like. The processing circuit may also be operably coupled to external devices such as an antenna 122, the display 124, operator controls, such as a button 128 and a keypad 126 among other components.

Figure 2:
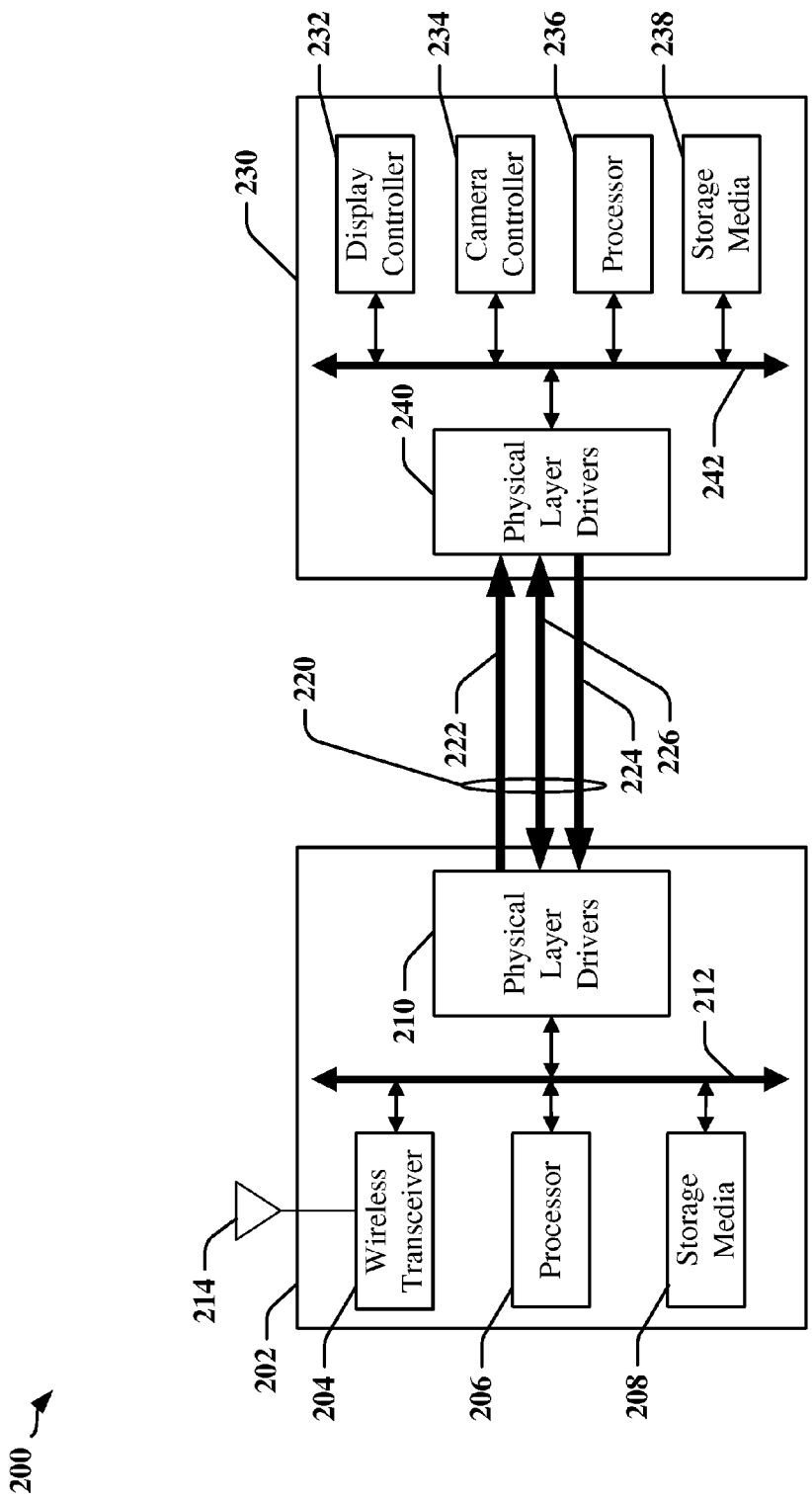
FIG. 2 illustrates a system architecture for an apparatus employing a data link between IC devices that selectively operates according to one of plurality of available standards.

FIG. 2 is a block schematic illustrating certain aspects of an apparatus 200 that includes a plurality of IC devices 202 and 230, which can exchange data and control information through a communication link 220. The communication link 220 may be used to connect a pair of IC devices 202 and 230 that are located in close proximity to one another, or that are physically located in different parts of the apparatus 200. In one example, the communication link 220 may be provided on a chip carrier, substrate or circuit board that carries the IC devices 202 and 230. In another example, a first IC device 202 may be located in a keypad section of a flip-phone while a second IC device 230 may be located in a display section of the flip-phone. In another example, a portion of the communication link 220 may include a cable or optical connection.

The communication link 220 may include multiple channels 222, 224 and 226. One or more channel 226 may be bidirectional, and may operate in half-duplex and/or full-duplex modes. One or more channel 222 and 224 may be unidirectional. The communication link 220 may be asymmetrical, providing higher bandwidth in one direction. In one example described herein, a first communications channel 222 may be referred to as a forward channel 222 while a second communications channel 224 may be referred to as a reverse channel 224. The first IC device 202 may be designated as a host system or transmitter, while the second IC device 230 may be designated as a client system or receiver, even if both IC devices 202 and 230 are configured to transmit and receive on the communications channel 222. In one example, the forward channel 222 may operate at a higher data rate when communicating data from a first IC device 202 to a second IC device 230, while the reverse channel 224 may operate at a lower data rate when communicating data from the second IC device 230 to the first IC device 202.

The IC devices 202 and 230 may each include a processor or other processing and/or computing circuit or device 206, 236. In one example, the first IC device 202 may perform core functions of the apparatus 200, including establishing and maintaining wireless communications through a wireless transceiver 204 and an antenna 214, while the second IC device 230 may support a user interface that manages or operates a display controller 232, and may control operations of a camera or video input device using a camera controller 234. Other features supported by one or more of the IC devices 202 and 230 may include a keyboard, a voice-recognition component, and other input or output devices. The display controller 232 may include circuits and software drivers that support displays such as a liquid crystal display (LCD) panel, touch-screen display, indicators and so on. The storage media 208 and 238 may include transitory and/or non-transitory storage devices adapted to maintain instructions and data used by respective processors 206 and 236, and/or other components of the IC devices 202 and 230. Communication between each processor 206, 236 and its corresponding storage media 208 and 238 and other modules and circuits may be facilitated by one or more internal bus 212 and 242 and/or a channel 222, 224 and/or 226 of the communication link 220.

The reverse channel 224 may be operated in the same manner as the forward channel 222, and the forward channel 222, and the reverse channel 224 may be capable of transmitting at comparable speeds or at different speeds, where speed may be expressed as data transfer rate and/or clocking rates. The forward and reverse data rates may be substantially the same or differ by orders of magnitude, depending on the application. In some applications, a single bidirectional channel 226 may support communications between the first IC device 202 and the second IC device 230. The forward channel 222 and/or the reverse channel 224 may be configurable to operate in a bidirectional mode when, for example, the forward and reverse channels 222 and 224 share the same physical connections and operate in a half-duplex manner. In one example, the communication link 220 may be operated to communicate control, command and other information between the first IC device 202 and the second IC device 230 in accordance with an industry or other standard.

The communication link 220 of FIG. 2 may be implemented according to MIPI Alliance specifications for C-PHY and may provide a wired bus that includes a plurality of signal wires (denoted as M wires). The M wires may be configured to carry N-phase encoded data in a high-speed digital interface, such as a mobile display digital interface (MDDI). The M wires may facilitate N-phase polarity encoding on one or more of the channels 222, 224 and 226. The physical layer drivers 210 and 240 may be configured or adapted to generate N-phase polarity encoded data for transmission on the communication link 220. The use of N-phase polarity encoding provides high speed data transfer and may consume half or less of the power of other interfaces because fewer drivers are active in N-phase polarity encoded data links.

N-phase polarity encoding devices 210 and/or 240 can typically encode multiple bits per transition on the communication link 220. In one example, a combination of 3-phase encoding and polarity encoding may be used to support a wide video graphics array (WVGA) 80 frames per second LCD driver IC without a frame buffer, delivering pixel data at 810 Mbps for display refresh.

Figure 3:
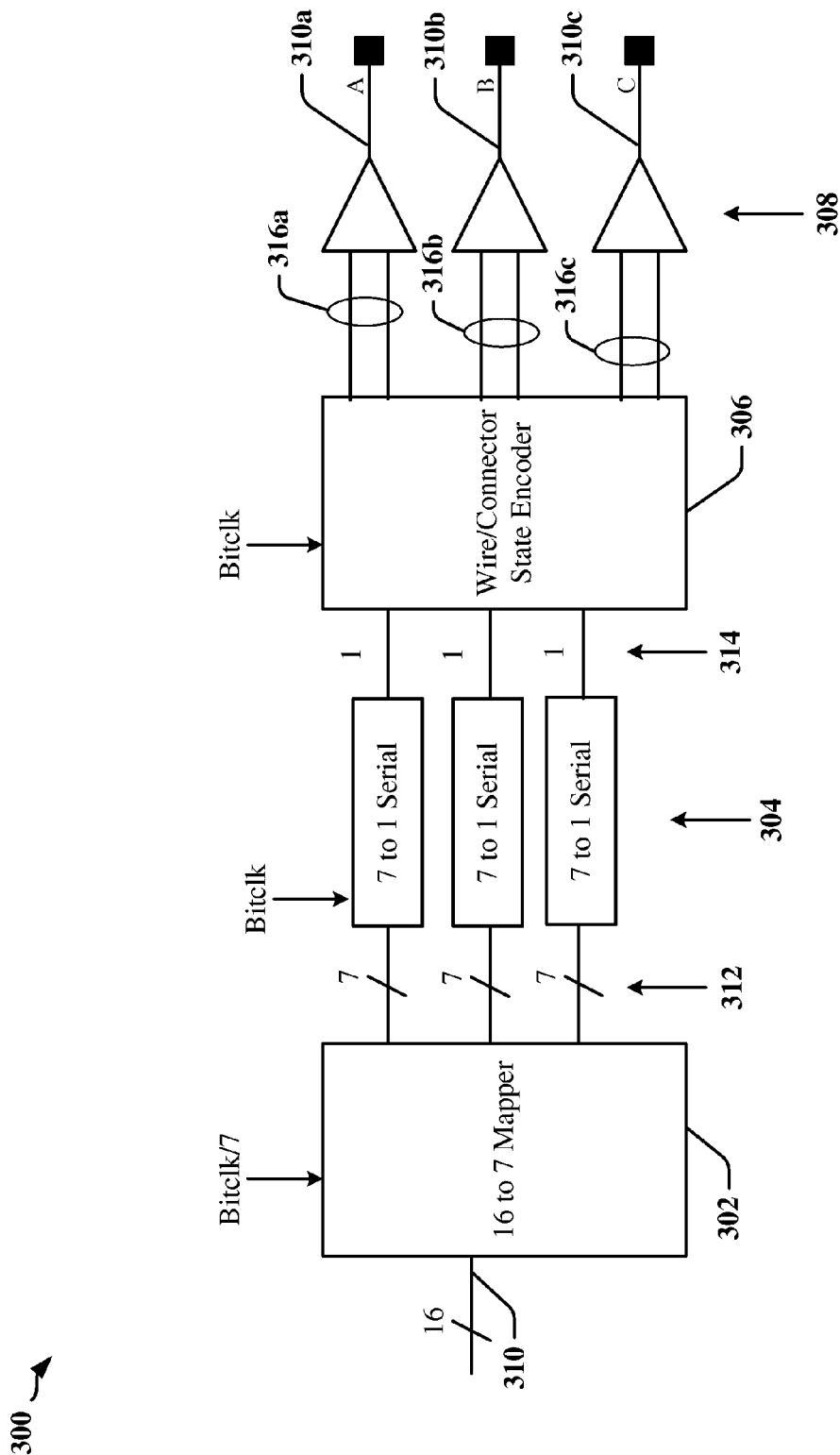
FIG. 3 illustrates a C-PHY 3-phase data encoder.

FIG. 3 is a schematic diagram 300 illustrating a 3-wire, 3-phase polarity encoder that may be used to implement certain aspects of the communication link 220 depicted in FIG. 2. The example of 3-wire, 3-phase encoding is selected solely for the purpose of simplifying descriptions of certain aspects of the invention. The principles and techniques disclosed for 3-wire, 3-phase encoders can be applied in other configurations of M-wire, N-phase polarity encoders.

Signaling states defined for each of the 3 wires in a 3-wire, 3-phase polarity encoding scheme may include an undriven state, a positively driven state and a negatively driven state. The positively driven state and the negatively driven state may be obtained by providing a voltage differential between two of the signal wires 310a, 310b and/or 310c, and/or by driving a current through two of the signal wires 310a, 310b and/or 310c connected in series such that the current flows in different directions in the two signal wires 310a, 310b and/or 310c. The undriven state may be realized by placing an output of a driver of a signal wire 310a, 310b or 310c in a high-impedance mode. Alternatively, or additionally, an undriven state may be obtained on a signal wire 310a, 310b or 310c by passively or actively causing an "undriven" signal wire 310a, 310b or 310c to attain a voltage level that lies substantially halfway between positive and negative voltage levels provided on driven signal wires 310a, 310b and/or 310c. Typically, there is no significant current flow through an undriven signal wire 310a, 310b or 310c. Signaling states defined for a 3-wire, 3-phase polarity encoding scheme may be denoted using the three voltage or current states (+1, −1, and 0).

A 3-wire, 3-phase polarity encoder may employ line drivers 308 to control the signaling state of signal wires 310a, 310b and 310c. The drivers 308 may be implemented as unit-level current-mode or voltage-mode drivers. In one example, each driver 308 may receive sets of two or more of signals 316a, 316b and 316c that determine the output state of corresponding signal wires 310a, 310b and 310c. In one example, the sets of two signals 316a, 316b and 316c may include a pull-up signal (PU signal) and a pull-down signal (PD signal) that, when high, activate pull-up and pull down circuits that drive the signal wires 310a, 310b and 310c toward a higher level or lower level voltage, respectively. In this example, when both the PU signal and the PD signal are low, the signal wires 310a, 310b and 310c may be terminated to a mid-level voltage.

For each transmitted symbol interval in an M-wire, N-phase polarity encoding scheme, at least one signal wire 310a, 310b or 310c is in the midlevel/undriven (0) voltage or current state, while the number of positively driven (+1 voltage or current state) signal wires 310a, 310b or 310c is equal to the number of negatively driven (−1 voltage or current state) signal wires 310a, 310b or 310c, such that the sum of current flowing to the receiver is always zero. For each symbol, the state of at least one signal wire 310a, 310b or 310c is changed from the symbol transmitted in the preceding transmission interval.

In operation, a mapper 302 may receive and map 16-bit data 310 to 7 symbols 312. In the 3-wire example, each of the 7 symbols defines the states of the signal wires 310a, 310b and 310c for one symbol interval. The 7 symbols 312 may be serialized using parallel-to-serial converters 304 that provide a timed sequence of symbols 314 for each signal wire 310a, 310b and 310c. The sequence of symbols 314 is typically timed using a transmission clock. A 3-wire 3-phase encoder 306 receives the sequence of 7 symbols 314 produced by the mapper one symbol at a time and computes the state of each signal wire 310a, 310b and 310c for each symbol interval. The 3-wire encoder 306 selects the states of the signal wires 310a, 310b and 310c based on the current input symbol 314 and the previous states of signal wires 310a, 310b and 310c.

The use of M-wire, N-phase encoding permits a number of bits to be encoded in a plurality of symbols where the bits per symbol is not an integer. In the example of a 3-wire communications link, there are 3 available combinations of 2 wires, which may be driven simultaneously, and 2 possible combinations of polarity on the pair of wires that is driven, yielding 6 possible states. Since each transition occurs from a current state, 5 of the 6 states are available at every transition. The state of at least one wire is required to change at each transition. With 5 states, $\log_2(5) \cong 2.32$ bits may be encoded per symbol. Accordingly, a mapper may accept a 16-bit word and convert it to 7 symbols because 7 symbols carrying 2.32 bits per symbol can encode 16.24 bits. In other words, a combination of seven symbols that encode five states has $5^7$ (78,125) permutations. Accordingly, the 7 symbols may be used to encode the $2^{16}$ (65,536) permutations of 16 bits.

Figure 4:
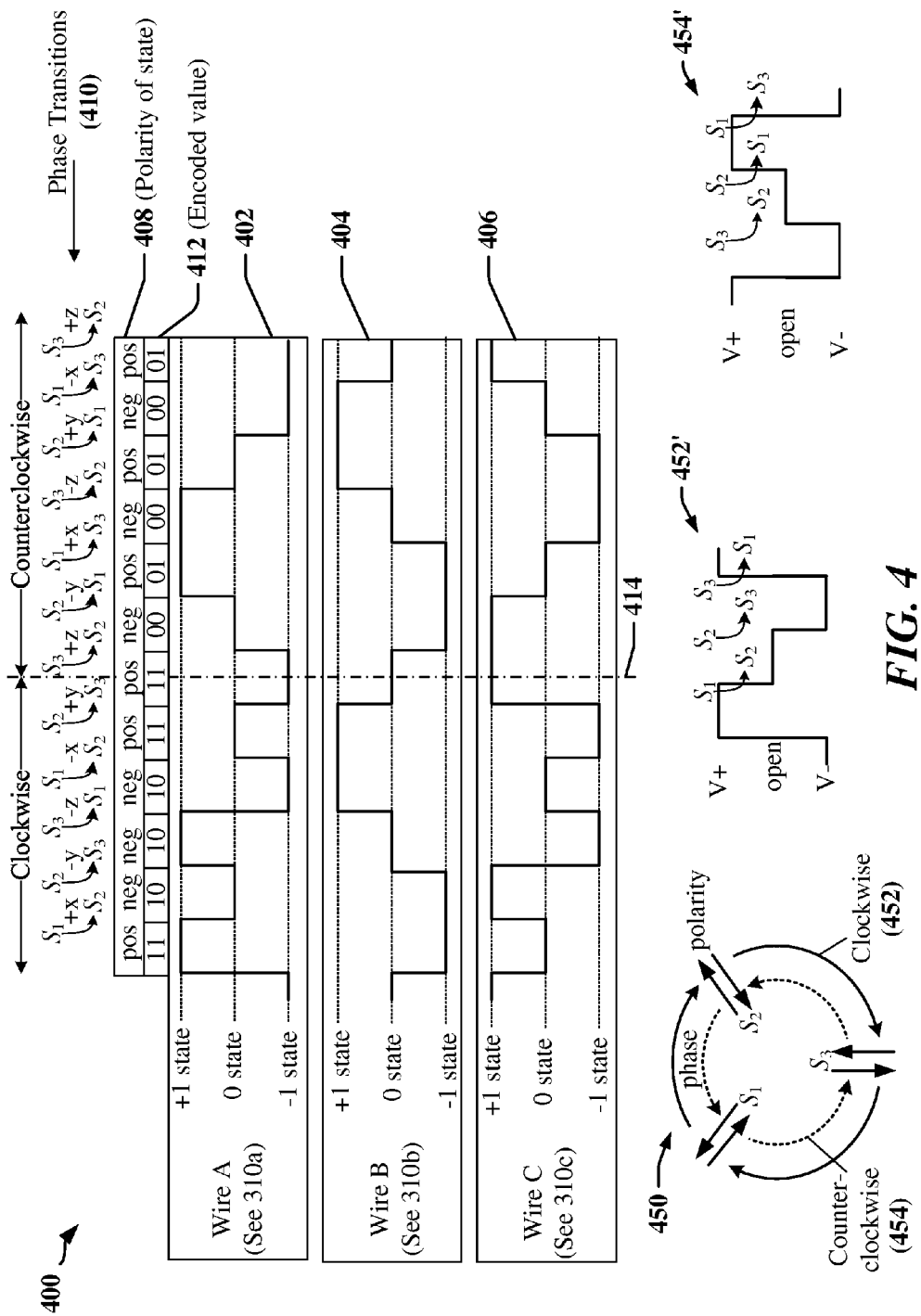
FIG. 4 illustrates signaling in a C-PHY 3-phase encoded interface.

FIG. 4 includes an example of a timing chart 400 for signals encoded using a three-phase modulation data-encoding scheme, which is based on the circular state diagram 450. Information may be encoded in a sequence of signaling states where, for example, a wire or connector is in one of three phase states $S_1$, $S_2$ and $S_3$ defined by the circular state diagram 450. Each state may be separated from the other states by a 120° phase shift. In one example, data may be encoded in the direction of rotation of phase states on the wire or connector. The phase states in a signal may rotate in clockwise direction 452 and 452' or counterclockwise direction 454 and 454'. In the clockwise direction 452 and 454' for example, the phase states may advance in a sequence that includes one or more of the transitions from $S_1$ to $S_2$, from $S_2$ to $S_3$ and from $S_3$ to $S_1$. In the counterclockwise direction 454 and 454', the phase states may advance in a sequence that includes one or more of the transitions from $S_1$ to $S_3$, from $S_3$ to $S_2$ and from $S_2$ to $S_1$. The three signal wires 310a, 310b and 310c carry different versions of the same signal, where the versions may be phase shifted by 120° with respect to one another. Each signaling state may be represented as a different voltage level on a wire or connector and/or a direction of current flow through the wire or connector. During each of the sequence of signaling states in a 3-wire system, each signal wire 310a, 310b and 310c is in a different signaling states than the other wires. When more than 3 signal wires 310a, 310b and 310c are used in a 3-phase encoding system, two or more signal wires 310a, 310b and/or 310c can be in the same signaling state at each signaling interval, although each state is present on at least one signal wire 310a, 310b and/or 310c in every signaling interval.

Information may be encoded in the direction of rotation at each phase transition 410, and the 3-phase signal may change direction for each signaling state. Direction of rotation may be determined by considering which signal wires 310a, 310b and/or 310c are in the '0' state before and after a phase transition, because the undriven signal wire 310a, 310b and/or 310c changes at every signaling state in a rotating three-phase signal, regardless of the direction of rotation.

The encoding scheme may also encode information in the polarity 408 of the two conductors 310a, 310b and/or 310c that are actively driven. At any time in a 3-wire implementation, exactly two of the conductors 310a, 310b, 310c are driven with currents in opposite directions and/or with a voltage differential. In one implementation, data may be encoded using two bit values 412, where one bit is encoded in the direction of phase transitions 410 and the second bit is encoded in the polarity 408 for the current state.

The timing chart 400 illustrates data encoding using both phase rotation direction and polarity. The curves 402, 404 and 406 relate to signals carried on three signal wires 310a, 310b and 310c, respectively for multiple phase states. Initially, the phase transitions 410 are in a clockwise direction and the most significant bit is set to binary '1,' until the rotation of phase transitions 410 switches at a time 414 to a counterclockwise direction, as represented by a binary '0' of the most significant bit. The least significant bit reflects the polarity 408 of the signal in each state.

According to certain aspects disclosed herein, one bit of data may be encoded in the rotation, or phase change in a 3-wire, 3-phase encoding system, and an additional bit may be encoded in the polarity of the two driven wires. Additional information may be encoded in each transition of a 3-wire, 3-phase encoding system by allowing transition to any of the possible states from a current state. Given 3 rotational phases and two polarities for each phase, 6 states are available in a 3-wire, 3-phase encoding system. Accordingly, 5 states are available from any current state, and there may be $\log_2(5) \cong 2.32$ bits encoded per symbol (transition), which allows the mapper 302 to accept a 16-bit word and encode it in 7 symbols.

N-Phase data transfer may use more than three wires provided in a communication medium, such as a bus. The use of additional signal wires that can be driven simultaneously provides more combinations of states and polarities and allows more bits of data to be encoded at each transition between states. This can significantly improve throughput of the system, and reduce the power consumption over approaches that use multiple differential pairs to transmit data bits, while providing increased bandwidth.

In one example, an encoder may transmit symbols using 6 wires with 2 pairs of wires driven for each state. The 6 wires may be labeled A through F, such that in one state, wires A and F are driven positive, wires B and E negative, and C and D are undriven (or carry no current). For six wires, there may be:

$$C(6, 4) = \frac{6!}{(6-4)! \cdot 4!} = 15$$

possible combinations of actively driven wires, with:

$$C(4, 2) = \frac{4!}{(4-2)! \cdot 2!} = 6$$

different combinations of polarity for each phase state.

The 15 different combinations of actively driven wires may include:

| A B C D | A B C E | A B C F | A B D E | A B D F |
| A B E F | A C D E | A C D F | A C E F | A D E F |
| B C D E | B C D F | B C E F | B D E F | C D E F |

Of the 4 wires driven, the possible combinations of two wires driven positive (and the other two must be negative). The combinations of polarity may include:

| + + − − | + − − + | + − + − | − + − + | − + + − | − − + + |

Accordingly, the total number of different states may be calculated as 15×6=90. To guarantee a transition between symbols, 89 states are available from any current state, and the number of bits that may be encoded in each symbol may be calculated as: $\log_2(89) \cong 6.47$ bits per symbol. In this example, a 32-bit word can be encoded by the mapper into 5 symbols, given that 5×6.47=32.35 bits.

The general equation for the number of combinations of wires that can be driven for a bus of any size, as a function of the number of wires in the bus and number of wires simultaneously driven:

$$C(N_{wires}, N_{driven}) = \frac{N_{wires}!}{(N_{wires} - N_{driven})! \cdot N_{driven}!}$$

one equation for calculating the number of combinations of polarity for the wires being driven is:

$$C\left(N_{driven}, \frac{N_{driven}}{2}\right) = \frac{N_{driven}!}{\left(\left(\frac{N_{driven}}{2}\right)!\right)^2}$$

The equivalent number of bits per symbol may be stated as:

$$\log_2\left(C(N_{wires}, N_{driven}) \cdot C\left(N_{driven}, \frac{N_{driven}}{2}\right) - 1\right)$$

Figure 5:
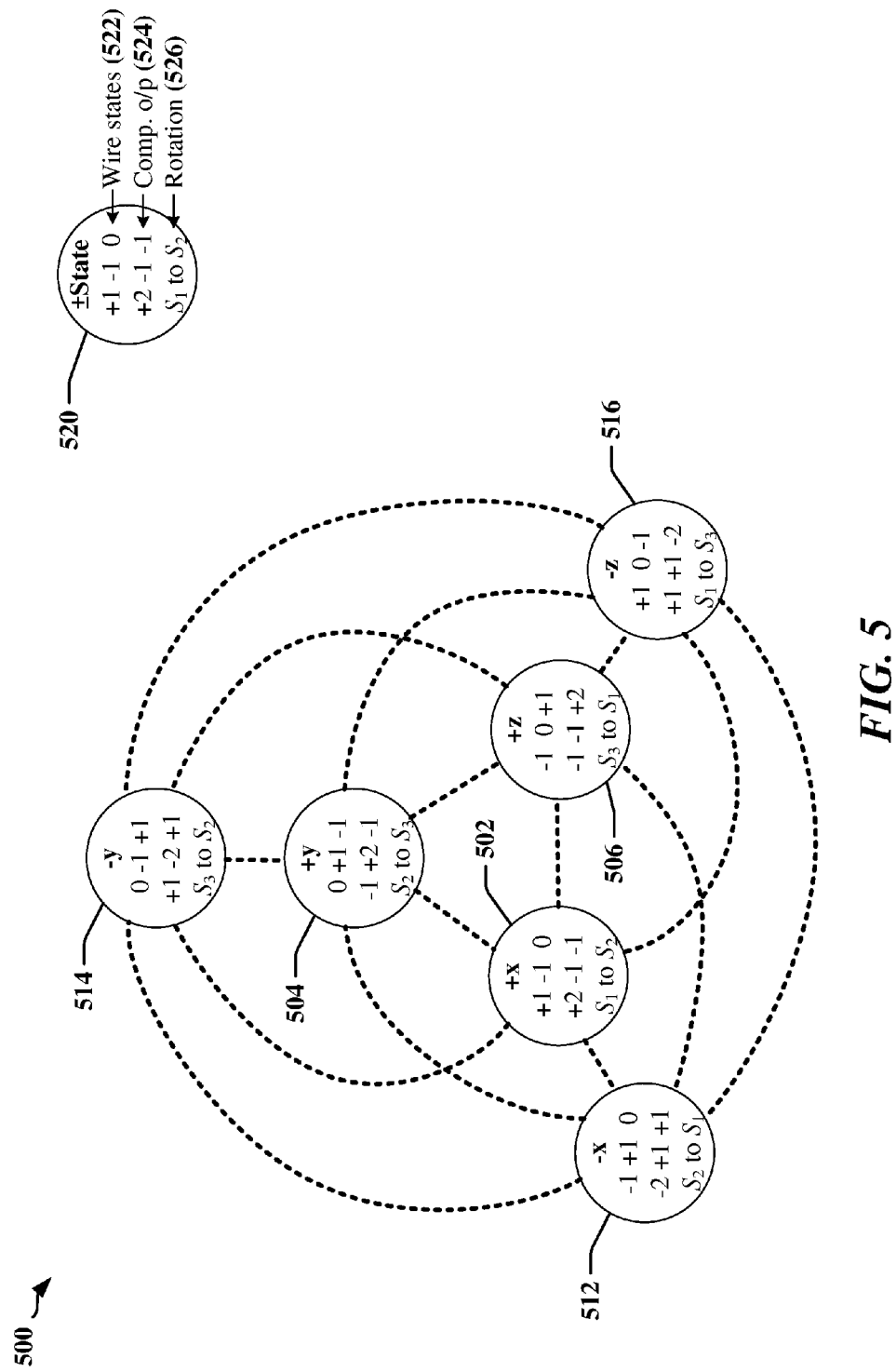
FIG. 5 is a state diagram illustrating potential state transitions in a C-PHY 3-phase encoded interface.

FIG. 5 is a state diagram 500 illustrating 6 states and 30 possible state transitions in one example of a 3-wire, 3-phase communication link. The possible states 502, 504, 506, 512, 514 and 516 in the state diagram 500 include and expand on the states shown in the circular state diagram 450 of FIG. 4. As shown in the exemplar of a state element 520, each state 502, 504, 506, 512, 514 and 516 in the state diagram 500 includes a field 522 showing the voltage state of signals A, B and C (transmitted on signal wires 310a, 310b and 310c respectively), a field 524 showing the result of a subtraction of wire voltages by differential receivers (see the differential receivers 602 of FIG. 6, for example), respectively and a field 526 indicating the direction of rotation. For example, in state 502 (+x) wire A=+1, wire B=−1 and wire C=0, yielding output of differential receiver 702a (A−B)=+2, differential receiver 702b (B−C)=−1 and differential receiver 702c (C−A)=+1. As illustrated by the state diagram, transition decisions taken by phase change detect circuitry in a receiver are based on 5 possible levels produced by differential receivers, which include −2, −1, 0, +1 and +2 voltage states.

Figure 6:
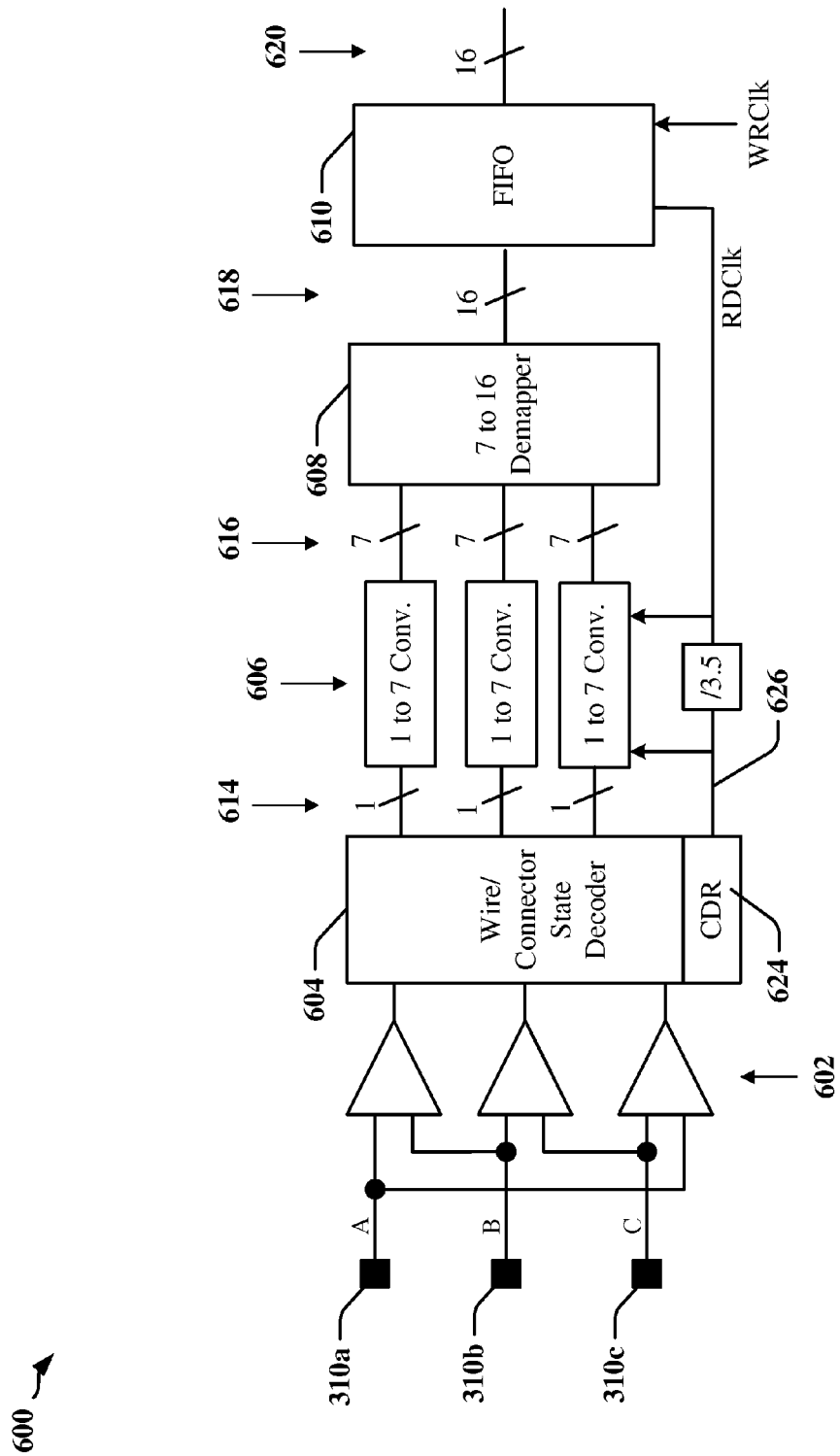
FIG. 6 illustrates a C-PHY decoder.

FIG. 6 is a diagram illustrating certain aspects of a 3-wire, 3-phase decoder 600. Differential receivers 602 and a wire state decoder 604 are configured to provide a digital representation of the state of the three transmission lines (e.g., the signal wires 310a, 310b and 310c illustrated in FIG. 3), with respect to one another, and to detect changes in the state of the three transmission lines compared to the state transmitted in the previous symbol period. Seven consecutive states are assembled by the serial-to-parallel converters 606 to obtain a set of 7 symbols to be processed by the demapper 608. The demapper 608 produces 16 bits of data that may be buffered in a first-in-first-out (FIFO) register 610.

The wire state decoder 604 may extract a sequence of symbols 614 from phase encoded signals received on the signal wires 310a, 310b and 310c. The symbols 614 are encoded as a combination of phase rotation and polarity as disclosed herein. The wire state decoder may include a CDR circuit 624 that extracts a clock 626 that can be used to reliably capture symbols from the signal wires 310a, 310b and 310c. A transition occurs on least one of the signal wires 310a, 310b and 310c at each symbol boundary and the CDR circuit 624 may be configured to generate the clock 626 based on the occurrence of a transition or multiple transitions. An edge of the clock may be delayed to allow time for all signal wires 310a, 310b and 310c to have stabilized and to thereby ensure that the current symbol is captured for decoding purposes.

Jitter in 3-Phase Interfaces

A 3-phase transmitter includes drivers that provide high, low and middle-level voltages onto the transmit channel. This results in some variable transitions between consecutive symbol intervals. Low-to-high and high-to-low voltage transitions may be referred to as full-swing transitions, while low-to-middle and high-to-middle voltage transitions may be referred to as half-swing transitions. Different types of transitions may have different rise or fall times, and may result in different zero crossings at the receiver. These differences can result in "encoding jitter," which may impact link signal integrity performance.

Figure 7:
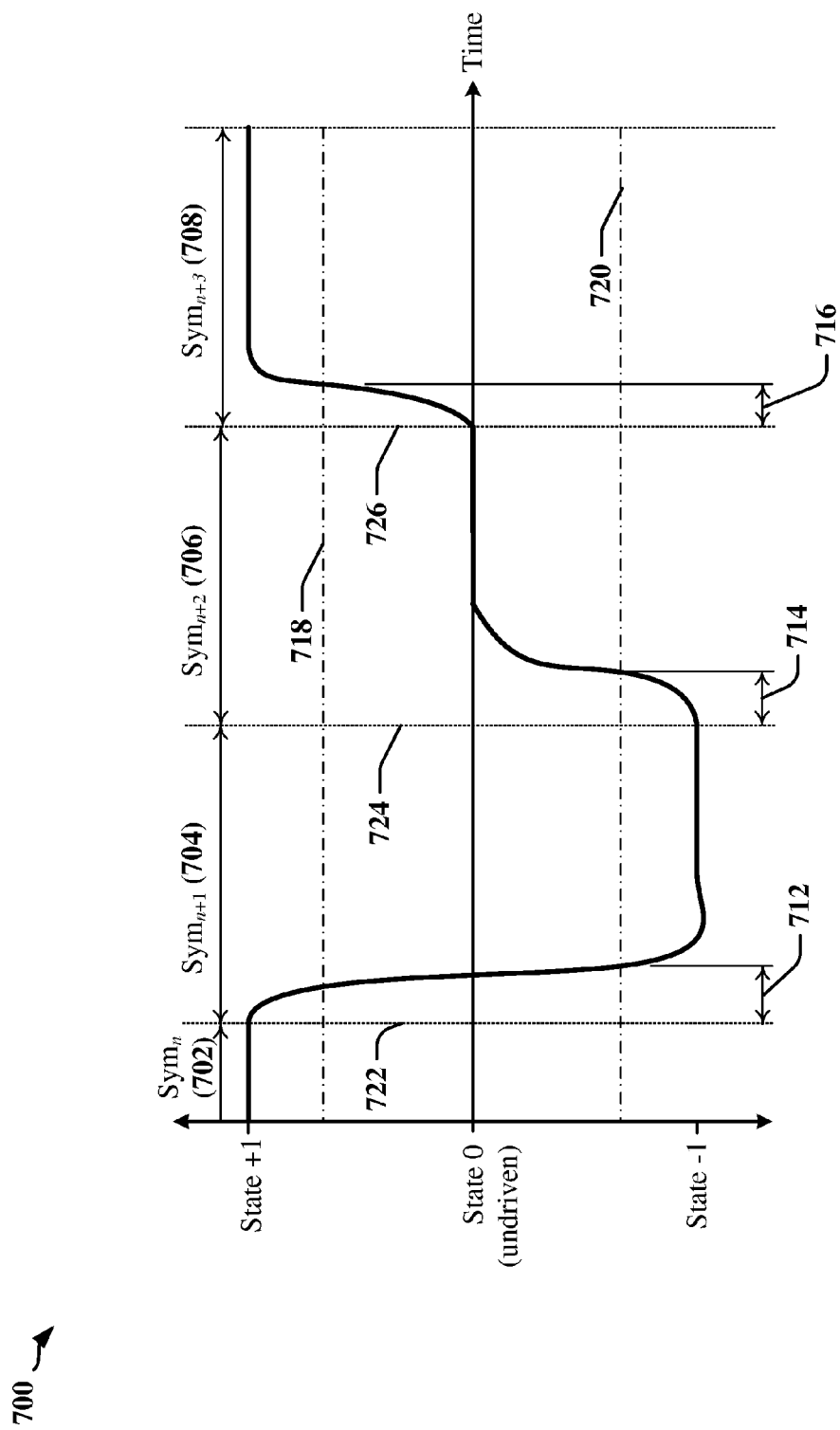
FIG. 7 is an example of the effects of signal rise times on transition detection in a C-PHY decoder.

FIG. 7 is a timing diagram 700 that illustrates certain aspects of transition variability at the output of a C-PHY 3-phase transmitter. Variability in signal transition times may be attributed to the existence of the different voltage and/or current levels used in 3-phase signaling. The timing diagram 700 illustrates transition times in a signal received from a single signal wire 310a, 310b or 310c. A first symbol $Sym_n$ 702 is transmitted in a first symbol interval that ends at a time 722 when a second symbol $Sym_{n+1}$ 724 is transmitted in a second symbol interval. The second symbol interval may end at time 726 when a third symbol $Sym_{n+2}$ 706 is transmitted in the third symbol interval, which ends when a fourth symbol $Sym_{n+3}$ 708 is transmitted in a fourth symbol interval. The transition from a state determined by the first symbol 702 to the state corresponding to the second symbol 704 may be detectable after a delay 712 attributable to the time taken for voltage in the signal wire 310a, 310b or 310c to reach a threshold voltage 718 and/or 720. The threshold voltages may be used to determine the state of the signal wire 310a, 310b or 310c. The transition from a state determined by the second symbol 704 to the state for the third symbol 706 may be detectable after a delay 714 attributable to the time taken for voltage in the signal wire 310a, 310b or 310c to reach one of the threshold voltages 718 and/or 720. The transition from a state determined by the third symbol 706 to the state for the fourth symbol 708 may be detectable after a delay 716 attributable to the time taken for voltage in the signal wire 310a, 310b or 310c to reach a threshold voltage 718 and/or 720. The delays 712, 714 and 716 may have different durations, which may be attributable in part to variations in device manufacturing processes and operational conditions, which may produce unequal effects on transitions between different voltage or current levels associated with the 3 states and/or different transition magnitudes. These differences may contribute to jitter and other issues in C-PHY 3-phase receiver.

Figure 8:
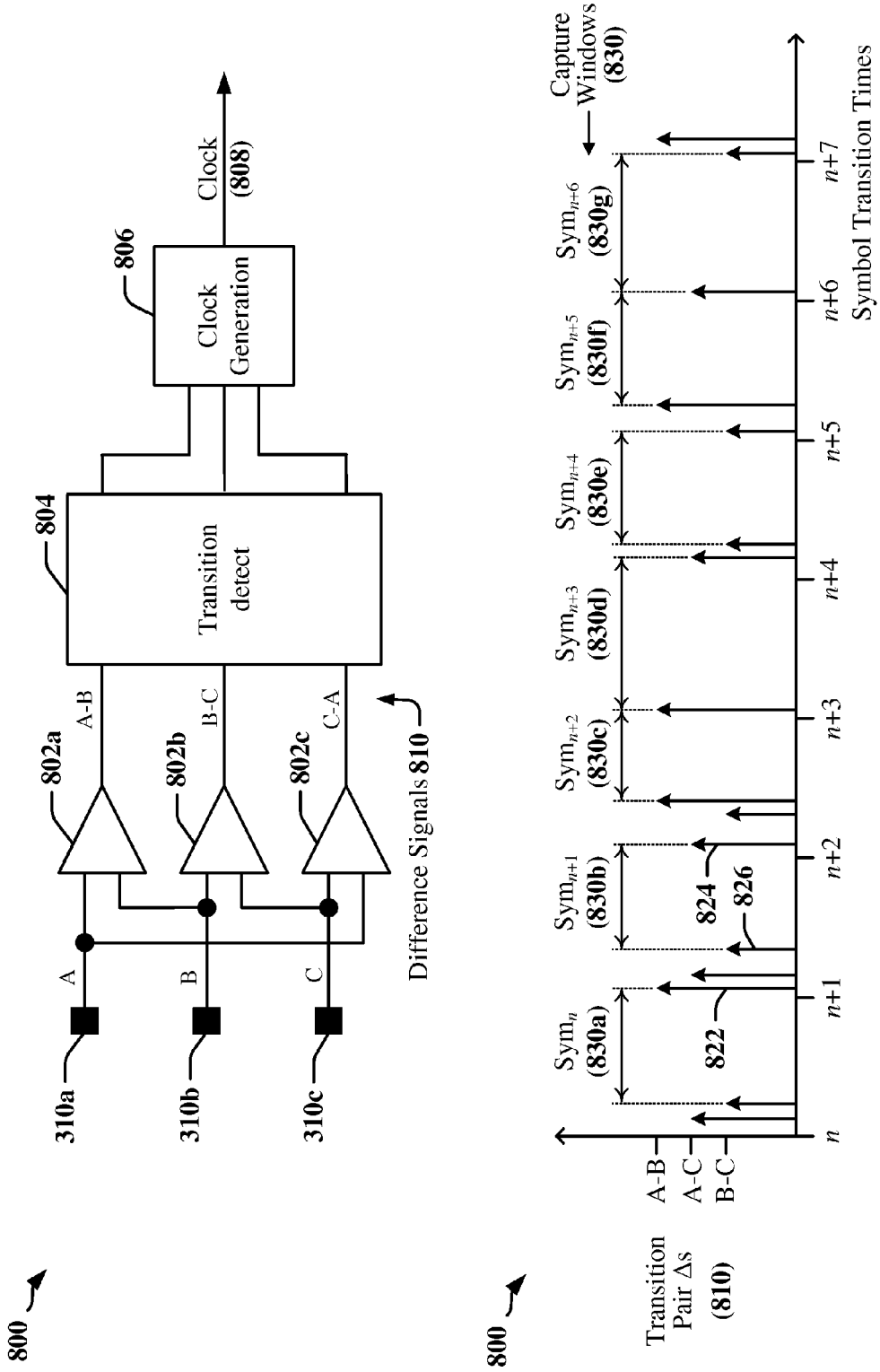
FIG. 8 illustrates transition detection in a C-PHY decoder.

FIG. 8 includes a block schematic 800 illustrating certain aspects of CDR circuits that may be provided in a receiver in a C-PHY 3-phase interface. A set of differential receivers 802a, 802b and 802c is configured to generate a set of difference signals 810 by comparing each of the three signal wires 310a, 310b and 310c in a trio with the other of the three signal wires 310a, 310b and 310c in the trio. In the example depicted, a first differential receiver 802a compares the states of signal wires 310a and 310b, a second differential receiver 802b compares the states of signal wires 310b and 310c and a third differential receiver 802c compares the states of signal wires 310a and 310c. Accordingly, a transition detection circuit 804 can be configured to detect occurrence of a phase change because the output of at least one of the differential receivers 802a, 802b and 802c changes at the end of each symbol interval.

Certain transitions between transmitted symbols may be detectable by a single differential receiver 802a, 802b or 802c, while other transitions may be detected by two or more of the differential receivers 802a, 802b and 802c. In one example the states, or relative states of two wires may be unchanged after a transition and the output of a corresponding differential receiver 802a, 802b or 802c may also be unchanged after the phase transition. In another example, both wires in a pair of signal wires 310a, 310b and/or 310c may be in the same state in a first time interval and both wires may be in a same second state in a second time interval and the corresponding differential receiver 802a, 802b or 802c may be unchanged after the phase transition. Accordingly, a clock generation circuit 806 may include a transition detection circuit 804 and/or other logic to monitor the outputs of all differential receivers 802a, 802b and 802c in order to determine when a phase transition has occurred, The clock generation circuit may generate a receive clock signal 808 based on detected phase transitions.

Changes in signaling states of the 3 wires may be detected at different times for different combinations of the signal wires 310a, 310b and/or 310c. The timing of detection of signaling state changes may vary according to the type of signaling state change that has occurred. The result of such variability is illustrated in the timing chart 850 of FIG. 8. Markers 822, 824 and 826 represent occurrences of transitions in the difference signals 810 provided to the transition detection circuit 804. The markers 822, 824 and 826 are assigned different heights in the timing chart 850 for clarity of illustration only, and the relative heights of the markers 822, 824 and 826 are not intended to show a specific relationship to voltage or current levels, polarity or weighting values used for clock generation or data decoding. The timing chart 850 illustrates the effect of timing of transitions associated with symbols transmitted in phase and polarity on the three signal wires 310a, 310b and 310c. In the timing chart 850, transitions between some symbols may result in variable capture windows 830a, 830b, 830c, 830d, 830e, 830f and/or 830g (collectively symbol capture windows 830) during which symbols may be reliably captured. The number of state changes detected and their relative timing can result in jitter on the clock signal 808.

The throughput of a C-PHY communications link may be affected by duration and variability in signal transition times. For example, variability in detection circuits may be caused by manufacturing process tolerances, variations and stability of voltage and current sources and operating temperature, as well as by the electrical characteristics of the signal wires 310a, 310b and 310c. The variability in detection circuits may limit channel bandwidth.

Figure 9:
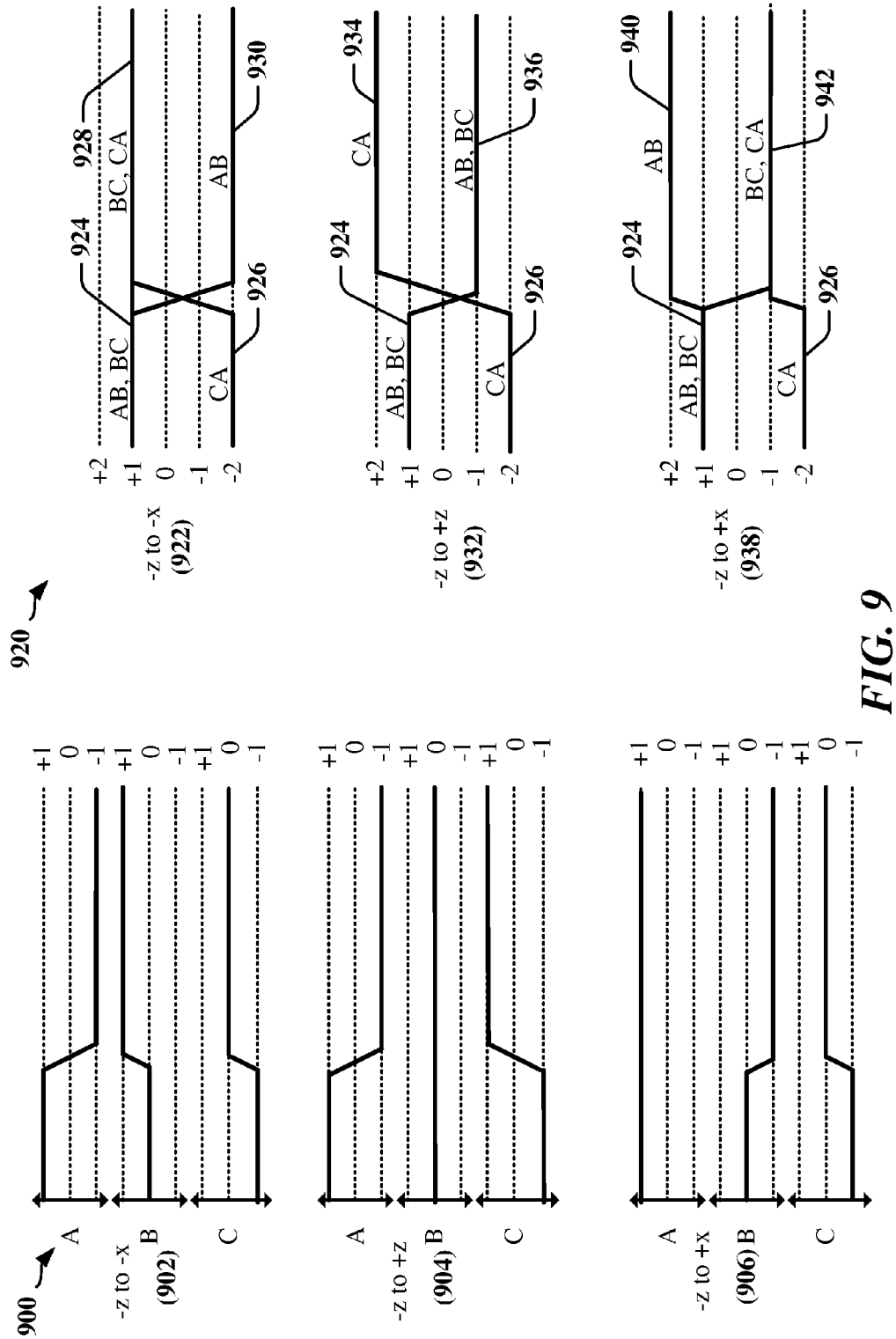
FIG. 9 illustrates one example of signal transitions occurring between pairs of consecutive symbols transmitted on a C-PHY interface.

FIG. 9 includes timing charts 900 and 920 representative of certain examples of transitions from a first signaling state to a second signaling state between certain consecutive symbols. The signaling state transitions illustrated in the timing charts 900 and 920 are selected for illustrative purposes, and other transitions and combinations of transitions can occur in a MIPI Alliance C-PHY interface. The timing charts 900 and 920 relate to an example of a 3-wire, 3-phase communications link, in which multiple receiver output transitions may occur at each symbol interval boundary due to differences in rise and fall time between the signal levels on the trio of wires. With reference also to FIG. 8, the first timing charts 900 illustrate the signaling states of the trio of signal wires 310a, 310b and 310c (A, B, and C) before and after a transition and second timing charts 920 illustrate the outputs of the differential receivers 802a, 802b and 802c, which provides difference signals 810 representative of the differences between signal wires 310a, 310b and 310c. In many instances, a set of differential receivers 802a, 802b and 802c may be configured to capture transitions by comparing different combinations for two signal wires 310a, 310b and 310c. In one example, these differential receivers 802a, 802b and 802c may be configured to produce outputs by determining the difference (e.g. by subtraction) of their respective input voltages.

In each of the examples shown in the timing charts 900 and 920, the initial symbol (−z) 516 (see FIG. 8) transitions to a different symbol. As shown in the timing charts 902, 904 and 906 signal A is initially in a +1 state, signal B is in a 0 state and signal C is in the −1 state. Accordingly, the differential receivers 802a, 802b initially measure a +1 difference 924 and the differential receiver 802c measures a −2 difference 926, as shown in the timing charts 922, 932, 938 for the differential receiver outputs.

In a first example corresponding to the timing charts 902, 922, a transition occurs from symbol (−z) 516 to symbol (−x) 512 (see FIG. 8) in which signal A transitions to a −1 state, signal B transitions to a +1 state and signal C transitions to a 0 state, with the differential receiver 802a transitioning from +1 difference 924 to a −2 difference 930, differential receiver 802b remaining at a +1 difference 924, 928 and differential receiver 802c transitioning from −2 difference 926 to a +1 difference 928.

In a second example corresponding to the timing charts 904, 932, a transition occurs from symbol (−z) 516 to symbol (+z) 506 in which signal A transitions to a −1 state, signal B remains at the 0 state and signal C transitions to a +1 state, with two differential receivers 802a and 802b transitioning from +1 difference 924 to a −1 difference 936, and differential receiver 802c transitioning from −2 difference 926 to a +2 difference 934.

In a third example corresponding to the timing charts 906, 938, a transition occurs from symbol (−z) 516 to symbol (+x) 502 in which signal A remains at the +1 state, signal B transitions to the −1 state and signal C transitions to a 0 state, with the differential receiver 802a transitioning from a +1 difference 924 to a +2 difference 940, the differential receiver 802b transitioning from a +1 difference 924 to a −1 difference 942, and the differential receiver 802c transitioning from −2 difference 926 to a −1 difference 942.

These examples illustrate transitions in difference values spanning 0, 1, 2, 3, 4 and 5 levels. Pre-emphasis techniques used for typical differential or single-ended serial transmitters were developed for two level transitions and may introduce certain adverse effects if used on a MIPI Alliance C-PHY 3-phase signal. In particular, a pre-emphasis circuit that overdrives a signal during transitions may cause overshoot during transitions spanning 1 or 2 levels and may cause false triggers to occur in edge sensitive circuits.

Figure 10:
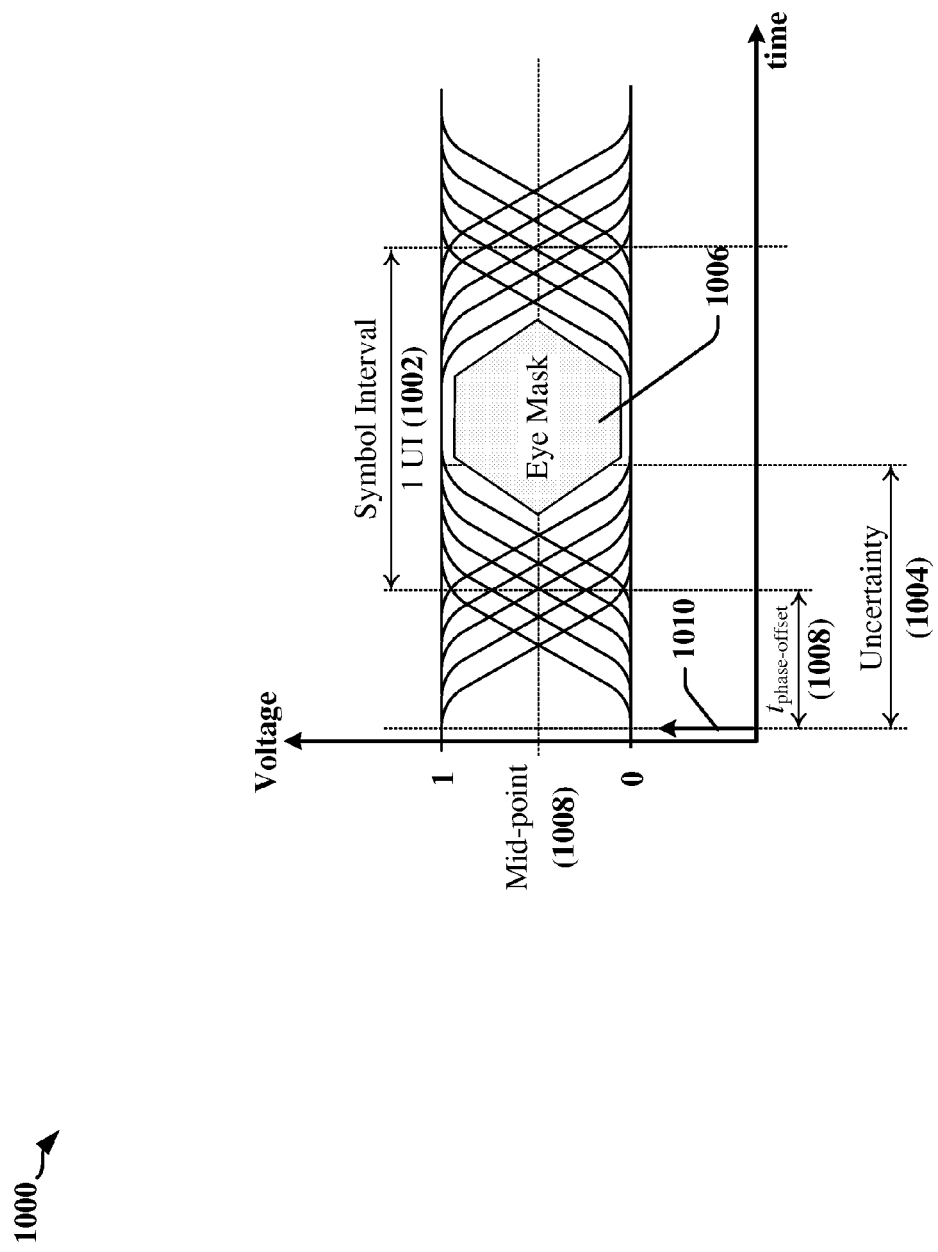
FIG. 10 illustrates transition regions and eye regions in an eye-pattern.

FIG. 10 illustrates an eye pattern 1000 generated as an overlay of multiple symbol intervals, including a single symbol interval 1002. A signal transition region 1004 represents a time period of uncertainty at the boundary between two symbols where variable signal rise times prevent reliable decoding. State information may be determined reliably in a region defined by an eye mask 1006 within an "eye opening" that represents the time period in which the symbol is stable and can be reliably received and decoded. The eye mask 1006 masks off a region in which zero crossings do not occur, and the eye mask is used by the decoder to prevent multiple clocking due to the effect of subsequent zero crossings at the symbol interval boundary that follow the first signal zero crossing.

The concept of periodic sampling and display of the signal is useful during design, adaptation and configuration of systems which use a clock-data recovery circuit that re-creates the received data-timing signal using frequent transitions appearing in the received data. A communication system based on Serializer/Deserializer (SERDES) technology is an example of a system where an eye pattern 1000 can be utilized as a basis for judging the ability to reliably recover data based on the eye opening of the eye pattern 1000.

An M-wire N-Phase encoding system, such as a 3-wire, 3-phase encoder may encode a signal that has at least one transition at every symbol boundary and the receiver may recover a clock using those guaranteed transitions. The receiver may require reliable data immediately prior to the first signal transition at a symbol boundary, and must also be able to reliably mask any occurrences of multiple transitions that are correlated to the same symbol boundary. Multiple receiver transitions may occur due to slight differences in rise and fall time between the signals carried on the M-wires (e.g. a trio of wires) and due to slight differences in signal propagation times between the combinations of signal pairs received (e.g. A–B, B–C, and C–A outputs of differential receivers 802a, 802b and 802c of FIG. 6).

Figure 11:
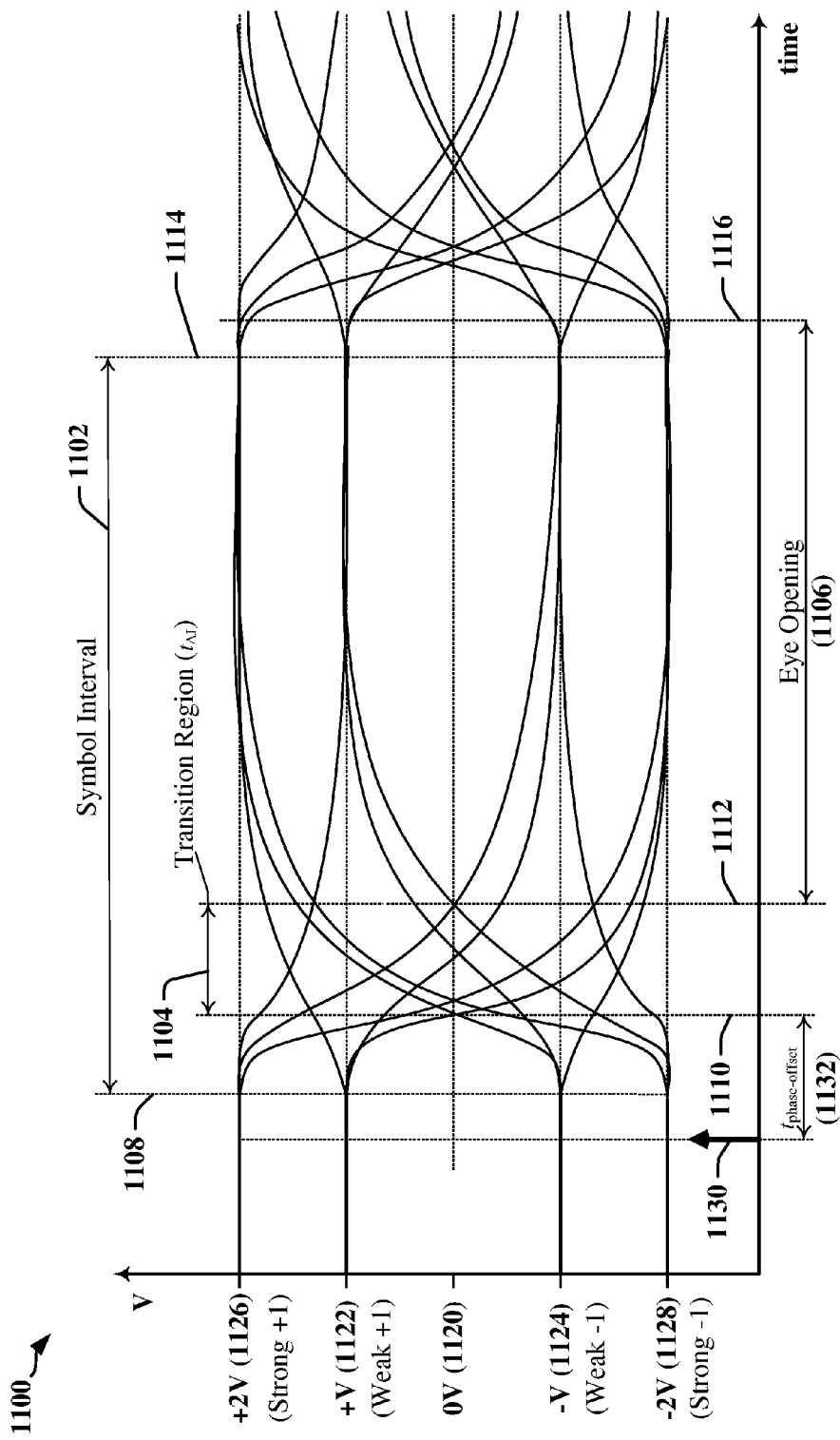
FIG. 11 illustrates an example of an eye-pattern generated for a C-PHY 3-Phase interface.

FIG. 11 illustrates an example of an eye-pattern 1100 generated for a C-PHY 3-phase signal. The eye-pattern 1100 may be generated from an overlay of multiple symbol intervals 1102. The eye-pattern 1100 may be produced using a fixed and/or symbol-independent trigger 1130. The eye-pattern 1100 includes an increased number of voltage levels 1120, 1122, 1124, 1126, 1128 that may be attributed to the multiple voltage levels measured by the differential receivers 802a, 802b, 802c an N-phase receiver circuit (see FIG. 8). In the example, the eye-pattern 1100 may correspond to possible transitions in 3-wire, 3-phase encoded signals provided to the differential receivers 802a, 802b, and 802c. The three voltage levels may cause the differential receivers 802a, 802b, and 802c to generate strong voltage levels 1126, 1128 and weak voltage levels 1122, 1124 for both positive and negative polarities. Typically, only one signal wire 310a, 310b and 310c is undriven in any symbol and the differential receivers 802a, 802b, and 802c do not produce a 0 state (here, 0 Volts) output. The voltages associated with strong and weak levels need not be evenly spaced with respect to a 0 Volts level. For example, the weak voltage levels 1122, 1124 represent a comparison of voltages that may include the voltage level reached by an undriven signal wire 310a, 310b and 310c. The eye-pattern 1100 may overlap the waveforms produced by the differential receivers 802a, 802b, and 802c because all three pairs of signals are considered simultaneously when data is captured at the receiving device. The waveforms produced by the differential receivers 802a, 802b, and 802c are representative of difference signals 810 representing comparisons of three pairs of signals (A–B, B–C, and C–A).

Drivers, receivers and other devices used in a C-PHY 3-Phase decoder may exhibit different switching characteristics that can introduce relative delays between signals received from the three wires. Multiple receiver output transitions may be observed at each symbol interval boundary 1108 and/or 1114 due to slight differences in the rise and fall time between the three signals of the trio of signal wires 310a, 310b, 310c and due to slight differences in signal propagation times between the combinations of pairs of signals received from the signal wires 310a, 310b, 310c. The eye-pattern 1100 may capture variances in rise and fall times as a relative delay in transitions near each symbol interval boundary 1108 and 1114. The variances in rise and fall times may be due to the different characteristics of the 3-Phase drivers. Differences in rise and fall times may also result in an effective shortening or lengthening of the duration of the symbol interval 1102 for any given symbol.

A signal transition region 1104 represents a time, or period of uncertainty, where variable signal rise times prevent reliable decoding. State information may be reliably determined in an "eye opening" 1106 representing the time period in which the symbol is stable and can be reliably received and decoded. In one example, the eye opening 1106 may be determined to begin at the end 1112 of the signal transition region 1104, and end at the symbol interval boundary 1114 of the symbol interval 1102. In the example depicted in FIG. 11, the eye opening 1106 may be determined to begin at the end 1112 of the signal transition region 1104, and end at a time 1116 when the signaling state of the signal wires 310a, 310b, 310c and/or the outputs of the three differential receivers 802a, 802b and 802c have begun to change to reflect the next symbol.

The maximum speed of a communication link 220 configured for N-Phase encoding may be limited by the duration of the signal transition region 1104 compared to the eye opening 1106 corresponding to the received signal. The minimum period for the symbol interval 1102 may be constrained by tightened design margins associated with the CDR circuit 624 in the decoder 600 illustrated in FIG. 6, for example. Different signaling state transitions may be associated with different variations in signal transition times corresponding to two or more signal wires 310a, 310b and/or 310c, thereby causing the outputs of the differential receivers 802a, 802b and 802c in the receiving device to change at different times and/or rates with respect to the symbol interval boundary 1108, where the inputs of the differential receivers 802a, 802b and 802c begin to change. The differences between signal transition times may result in timing skews between signaling transitions in two or more difference signals 810. CDR circuits may include delay elements and other circuits to accommodate timing skews between the difference signals 810.

Figure 12:
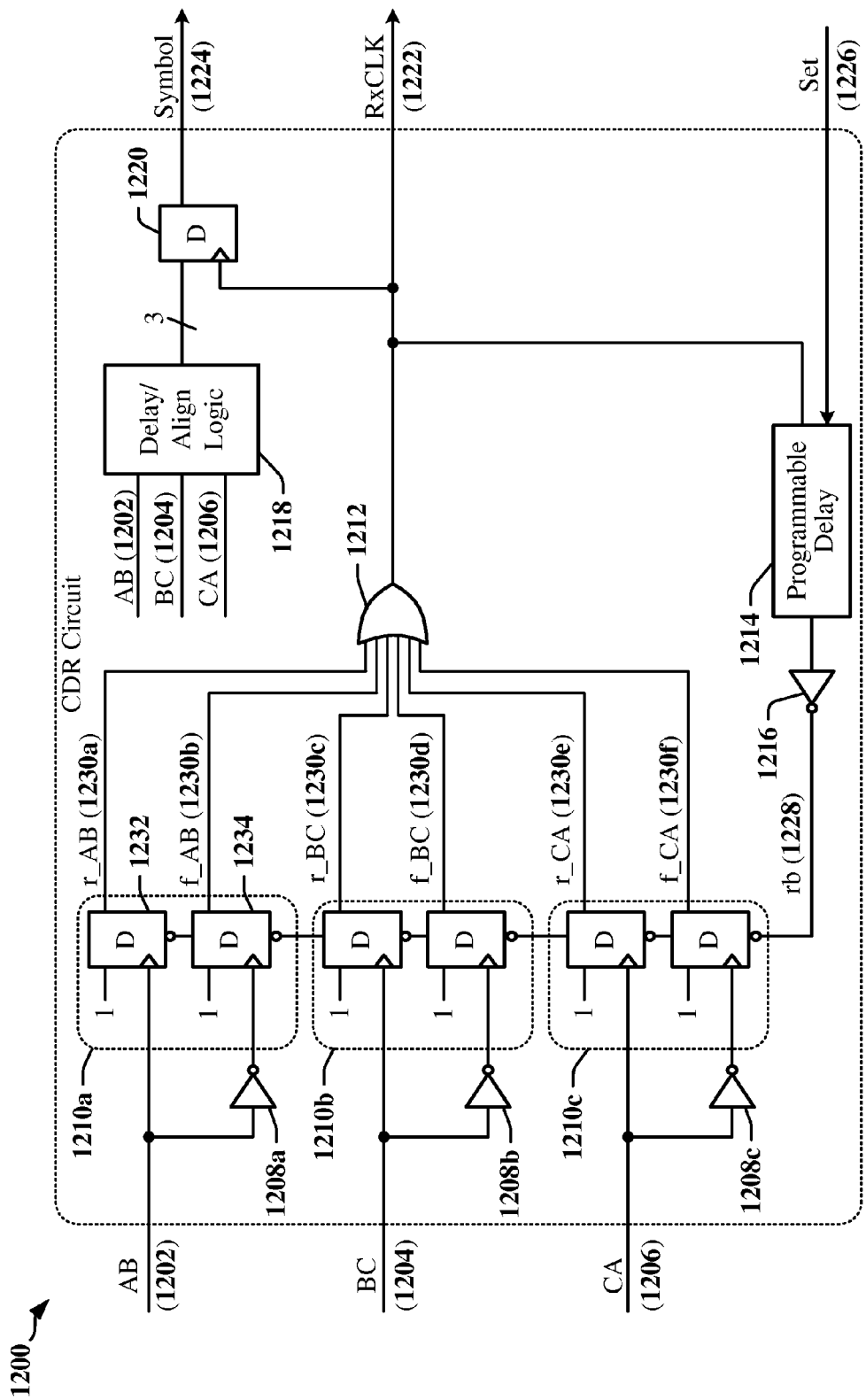
FIG. 12 illustrates an example of a CDR circuit for a C-PHY 3-Phase interface.

FIG. 12 provides an example of a CDR circuit 1200 for a 3-wire, 3-phase interface. The illustrated CDR circuit 1200 includes certain features and functional elements that are common to many different types of clock recovery circuits. The CDR circuit 1200 receives difference signals 1202, 1204, 1206, which may be derived from the difference signals 810 produced by the differential receivers 802a, 802b and 802c of FIG. 8 for example. In the CDR circuit 1200, each difference signal 1202, 1204, 1206 clocks a pair of D flip-flops 1210a, 1210b, 1210c to produce output signals 1230a-1230f. The output signals 1230a-1230f carry a pulse when a transition is detected on the corresponding difference signal 1202, 1204, 1206. A rising edge provided to a clock input on a D flip-flop clocks a logic one through the D flip-flop. Inverters 1208a, 1208b, 1208c may be used to provide inverted versions of the difference signals 1202, 1204, 1206 to one of the D flip-flops in each corresponding pair of D flip-flops 1210a, 1210b, 1210c. Accordingly, each pair of D flip-flops 1210a, 1210b, 1210c produces pulses responsive to rising edge and falling edges detected in the corresponding difference signal 1202, 1204, 1206.

For example, the AB difference signal 1202 is provided to a first D flip-flop 1232 of a first pair of D flip-flops 1210a, and the inverter 1208a provides an inverted version of the AB difference signal 1202 to a second D flip-flop 1234 of the first pair of D flip-flops 1210a. The D flip-flops are initially in a reset state. A rising edge on the AB difference signal 1202 clocks a logic one through the first D flip-flop 1232 causing the output of the first flip-flop (r_AB) 1230a to transition to a logic one state. A falling edge on the AB difference signal 1202 clocks a logic one through the second D flip-flop 1234 causing the output of the second flip-flop (f_AB) 1230b to transition to a logic one state.

The output signals 1230a-1230f are provided to logic, such as the OR gate 1212, which produces an output signal that may serve as the receiver clock (RxCLK) signal 1222. The RxCLK signal 1222 transitions to a logic one state when a transition occurs in signaling state of any of the difference signals 1202, 1204, 1206. The RxCLK signal 1222 is provided to a programmable delay element 1214, which drives a reset signal (rb) 1228 that resets the D flip-flops in the pairs of D flip-flops 1210a, 1210b, 1210c. In the illustrated example, an inverter 1216 may be included when the D flip-flops are reset by a low signal. When the D flip-flops are reset, the output of the OR gate 1212 returns to the logic zero state and the pulse on the RxCLK signal 1222 is terminated. When this logic zero state propagates through the programmable delay element 1214 and the inverter 1216, the reset condition on the D flip-flops is released. While the D flip-flops are in the reset condition, transitions on the difference signals 1202, 1204, 1206 are ignored.

The programmable delay element 1214 is typically configured to produce a delay that has a duration that exceeds the difference in the timing skew between the occurrence of first and last transitions on the difference signals 1202, 1204, 1206. The programmable delay element 1214 configures the duration of pulses (i.e., the pulse width) on the RxCLK signal 1222. The programmable delay element 1214 may be configured when a Set signal 1226 is asserted by a processor or other control and/or configuration logic.

The RxCLK signal 1222 may also be provided to a set of three flip-flops 1220 that capture the signaling state of the difference signals 1202, 1204, 1206, providing a stable output symbol 1224 for each pulse that occurs on the RxCLK signal 1222. Delay or alignment logic 1218 may adjust the timing of the set of difference signals 1202, 1204, 1206. For example, the delay or alignment logic 1218 may be used to adjust the timing of the difference signals 1202, 1204, 1206 with respect to the pulses on the RxCLK signal 1222 to ensure that the flip-flops 1220 capture the signaling state of the difference signals 1202, 1204, 1206 when the difference signals 1202, 1204, 1206 are stable. The delay or alignment logic 1218 may delay edges in the difference signals 1202, 1204, 1206 based on the delay configured for the programmable delay element 1214.

The programmable delay element 1214 may be configured in the CDR circuit 1200 to accommodate possible large variations in transition times in the difference signals 1202, 1204, 1206. In one example, the programmable delay element 1214 may introduce a minimum delay period that exceeds the duration of the timing skew between the occurrence of the first and last transitions on the difference signals 1202, 1204, 1206. For reliable operation of the CDR circuit 1200, the maximum delay time provided by the programmable delay element 1214 may not be greater than the symbol interval. At faster data rates, timing skew increases as a proportion of the symbol interval 1102, and the eye opening 1106 can become small in comparison to the symbol interval 1102. The maximum symbol transmission rate may be limited when the timing skew reduces the percentage of the symbol interval 1102 occupied by the eye opening 1106 below a threshold size that can support reliable capture of symbols.

Figure 13:
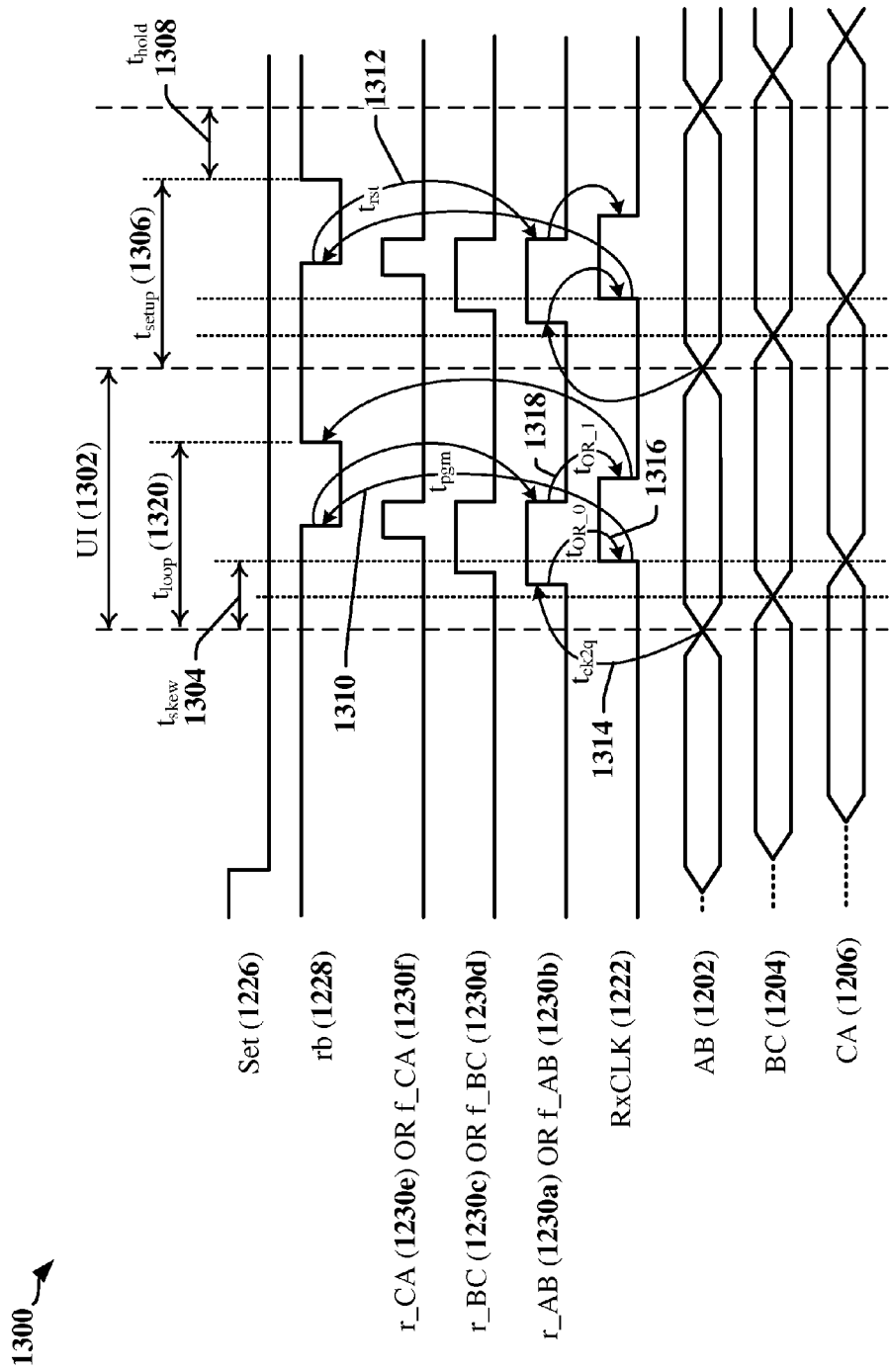
FIG. 13 illustrates timing associated with the CDR circuit of FIG. 12.

FIG. 13 is a timing diagram that illustrates certain aspects of the operation of the CDR circuit 1200. The diagram relates to operations after the programmable delay element 1214 has been configured, and the Set signal 1226 is inactive. The CDR circuit 1200 operates as an edge detector. C-PHY 3-phase encoding provides a single signaling state transition per unit interval (UI) 1302. Differences in the state of each wire of the trio, and/or transmission characteristics of the trio may cause a transition to appear at different times on two or more wires. The maximum difference in time of occurrence of transitions in the difference signals 1202, 1204, 1206 may be referred to as the skew time ($t_{skew}$) 1304. Other delays associated with the CDR circuit 1200 include the propagation delay ($t_{ck2q}$) 1314 through the pairs of D flip-flops 1210a, 1210b, 1210c, the propagation delay ($t_{OR\_0}$) 1316 associated with a rising edge passed through the OR gate 1212, the propagation delay ($t_{OR\_1}$) 1318 associated with a falling edge passed through the OR gate 1212, the programmable delay ($t_{pgm}$) 1310 combining the delay introduced by the programmable delay element 1214 and driver/inverter 1216, and the reset delay ($t_{rst}$) 1312 corresponding to the delay between time of receipt of the rb signal 1228 by the pairs of D flip-flops 1210a, 1210b, 1210c and time at which the flip-flop outputs are cleared.

A loop time ($t_{loop}$) 1320 may be defined as:

$$t_{loop} = t_{ck2q} + t_{OR\_1} + t_{pgm} + t_{rst} + t_{OR\_0} + t_{pgm}.$$

The relationship between $t_{loop}$ 1320 and the UI 1302 may determine the reliability of operation of the CDR circuit 1200. This relationship is affected by clock frequency used for transmission, which has a direct effect on the UI 1302, and variability in the operation of the programmable delay element 1214.

In some devices, the operation of the programmable delay element 1214 can be afflicted by variations in manufacturing process, circuit supply voltage, and die temperature (PVT). The delay time provided by the programmable delay element 1214 for a configured value may vary significantly from device to device, and/or from circuit to circuit within a device. In conventional systems, the nominal operating condition of the CDR circuit 1200 is generally set by design to generate a clock edge somewhere in the middle of the eye opening 1106 under all PVT conditions, in order to ensure that a clock edge occurs after the end 1112 of the signal transition region 1104 and prior to the commencement of the transition region to the next symbol, even under worst case PVT effects. Difficulty can arise in designing a CDR circuit 1200 that guarantees a clock edge within the eye opening 1106 when the transmission frequency increases and timing skew of the difference signals 1202, 1204, 1206 is large compared to the UI 1302. For example, a typical delay element may produce a delay value that changes by a factor of 2 over all PVT conditions.

Figure 14:
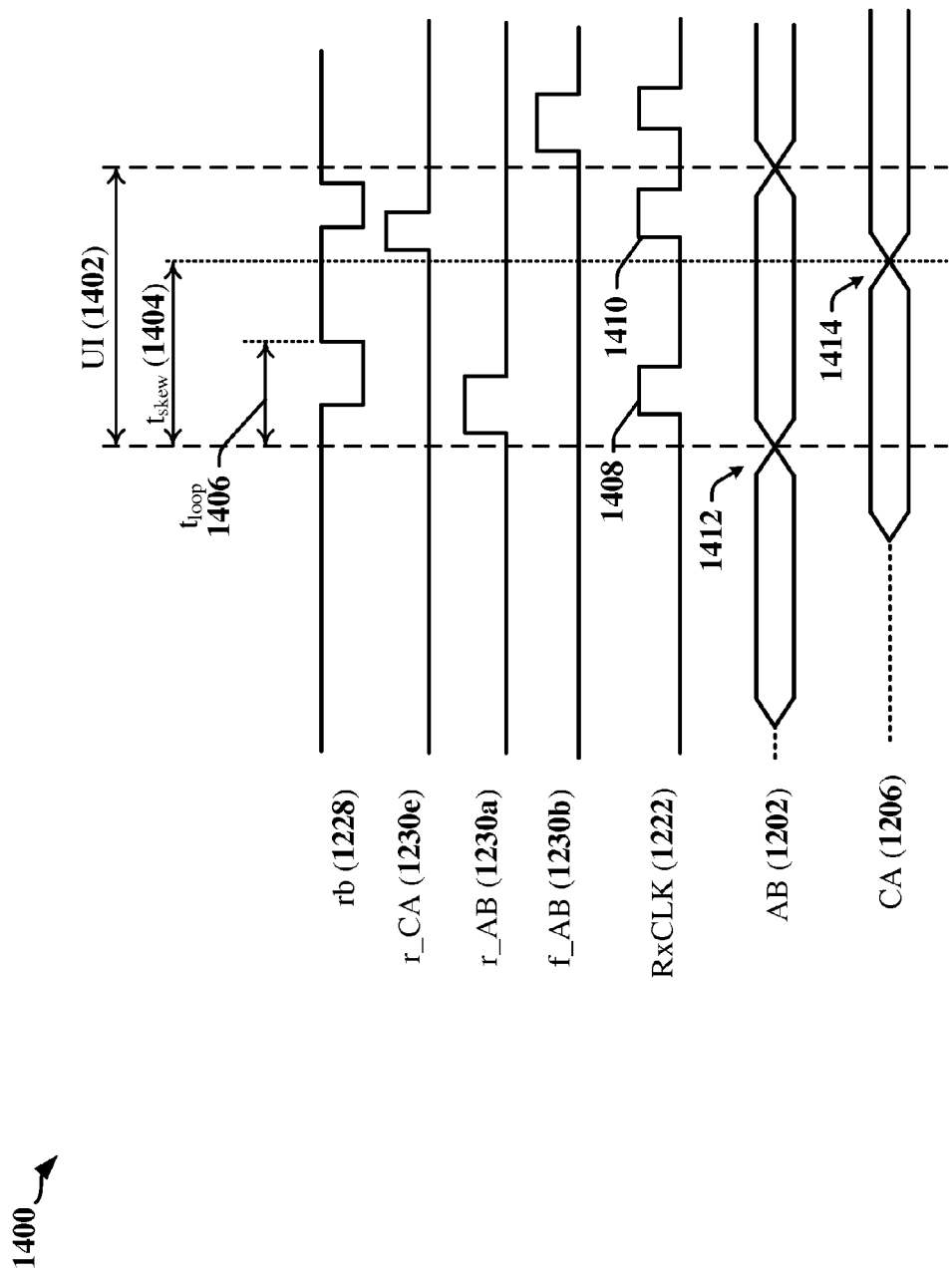
FIG. 14 illustrates timing associated with a CDR circuit that has a loop time that is shorter than the skew between signals transmitted on the C-PHY 3-Phase signal.

FIG. 14 is a timing diagram 1400 that illustrates the effect of a programmable delay element 1214 that provides an insufficient delay. In this example, $t_{loop}$ 1406 is too short for the observed $t_{skew}$ 1404, and multiple clock pulses 1408, 1410 are generated in one UI 1402. That is, the loop delay $t_{loop}$ 1406 is not big enough relative to $t_{skew}$ 1404, and later occurring transitions on the difference signals 1202, 1204, 1206 are not masked. In the depicted example, a second transition 1414 in one of the difference signals 1206 may be detected after a pulse 1408 has been generated in response to a first occurring transition 1412 in another of the difference signals 1202. In this example, the recovered clock frequency may be twice the clock frequency used to transmit symbols on the 3-phase interface.

Figure 15:
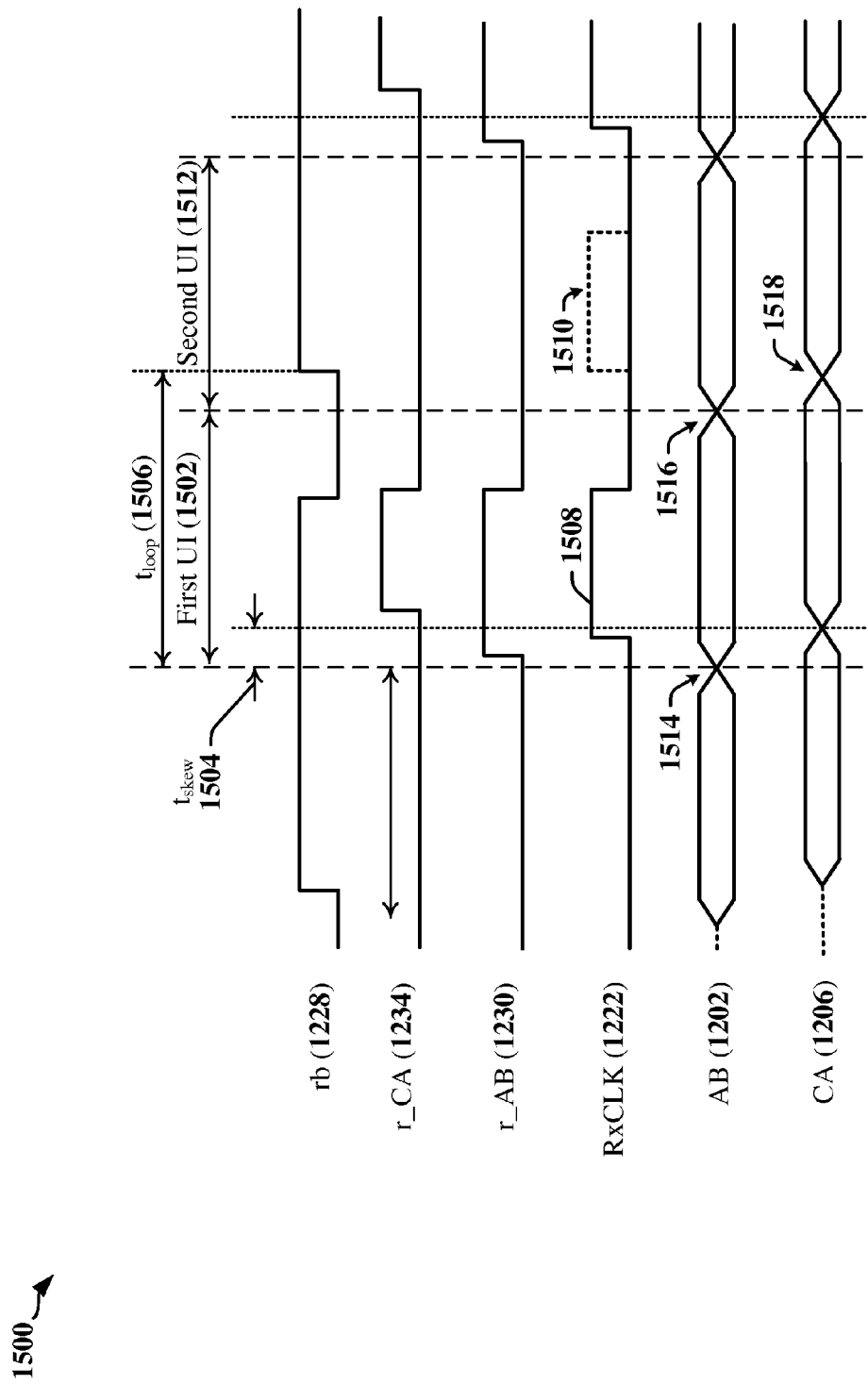
FIG. 15 illustrates timing associated with a CDR circuit that has a loop time that is longer than a symbol interval of the C-PHY 3-Phase signal.

FIG. 15 is a timing diagram 1500 that illustrates the effect of a programmable delay element 1214 that provides a delay that is too long. In this example, $t_{loop}$ 1506 is greater than the UI 1502. The CDR circuit 1200 may generate a clock pulse 1508 in response to a first-occurring transition 1514 in a first UI 1502, but the rb signal 1228 may be active when transitions 1516, 1518 occur in a second UI 1512, In the example depicted, the transitions 1516, 1518 in the second UI 1512 are masked, and the expected pulse 1510 corresponding to the second UI 1512 is suppressed. In this example, the recovered clock frequency may be half the clock frequency used to transmit symbols on the 3-phase interface.

As illustrated by the examples of FIGS. 14 and 15, the CDR circuit 1200 may be subject to the constraint:

$$t_{skew} < t_{loop} < UI.$$

Empirical evidence suggests that $t_{loop}$ 1320, 1406, 1506 is very sensitive to PVT. In some instances, the delay provided by the programmable delay element 1214 may be increased to accommodate the range of potential variations of PVT. As data rates increase, decreases and $t_{skew}$ increases proportionately with respect to the UI, reducing the potential range of delays available to configure the programmable delay element 1214.

Improved Clock Generation for C-PHY 3-Phase Interfaces

According to certain aspects disclosed herein, a clock recovery circuit used in a C-PHY multi-phase receiver can avoid issues associated with variations in PVT. A clock recovery circuit may be adapted to detect transitions in some UIs, and to suppress detection of transitions in other UIs. The clock recovery circuit may generate interpolated pulses for UIs in which transition detection is suppressed. In a first mode of operation, a programmed delay may be configured to cause a CDR circuit to suppress detection of transitions in a second-occurring UI after detecting a transition in first-occurring UI. In this first mode of operation, the CDR circuit generates a clock signal with a frequency that is half the frequency of the symbol transmission frequency. In a second mode of operation, the programmed delay may be configured to cause the CDR circuit to suppress detection of transitions in two succeeding UIs after detecting a transition in first-occurring UI. In the second mode of operation, the CDR circuit generates a clock signal with a frequency that is one-third of the frequency of the symbol transmission frequency. Other modes of operation may produce frequencies that are a quarter or less of the symbol frequency, etc. A delay-locked loop (DLL) may be used to generate clock pulses corresponding to UIs in which transition detection is suppressed. The clock pulses generated by the DLL may be inserted between pulses of the clock signal produced by the CDR circuit.

Figure 16:
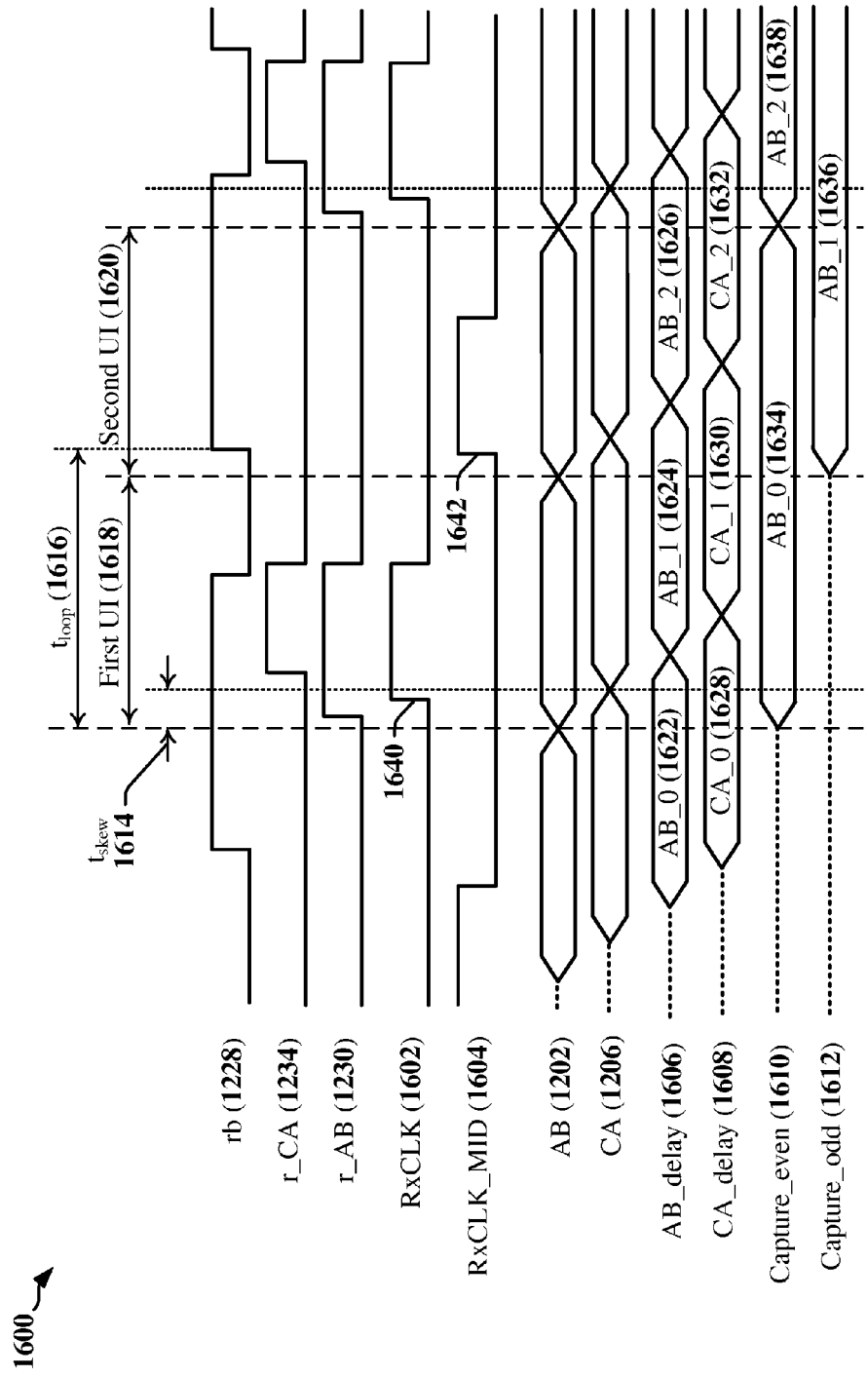
FIG. 16 is a timing diagram that illustrates the operation of a CDR adapted in accordance with certain aspects disclosed herein.

FIG. 16 is a timing diagram 1600 that illustrates clock generation in accordance with certain aspects disclosed herein. One or more programmable delay elements in a clock recovery circuit may be adapted, and/or configured with delays such that edge detection and pulse generation is suppressed in a proportion of UIs 1618, 1620. In the illustrated example, a pulse generating circuit or loop provides a clock pulse in an RxCLK signal 1602 for a first UI 1618, but does not detect the transitions in a second, succeeding UI 1620. The clock recovery circuit may include or cooperate with a DLL circuit that supplies a pulse 1642 corresponding to the second UI 1620 in an intermediate clock signal (RxCLK_MID) 1604. The pulse-generating circuit or loop may be configured to miss or ignore transitions in two or more UIs 1620 after generating the pulse 1640 in the first UI 1616, with one or more DLL circuits supplying pulses for the UIs 1620 during which pulse generation is suppressed when, for example, transitions are ignored. The pulses generated by the one or more DLLs may be positioned between, and with respect to rising edges of the RxCLK signal 1602. FIG. 16 illustrates a half-rate example in which the RxCLK_MID signal 1604 is generated with a 180 degree phase shift with respect to the RxCLK signal 1602.

The RxCLK signal 1602 and the RXCLK_MID signal 1604 may be used to sample delayed versions of the difference signals 1202, 1204, 1206, including for example the AB_delay signal 1606, which is a delayed version of the AB signal 1202, and the CA_delay signal 1608, which is a delayed version of the CA signal 1206. The RxCLK signal 1602 captures even-occurring symbols 1622/1628, 1626/1632 to provide symbols 1634 and 1638 in the Capture_even signal 1610, while the RXCLK_MID signal 1604 captures odd-occurring symbols 1624/1630 to provide symbols 1636 in the Capture_odd signal 1612.

In some instances, the Capture_even signal 1610 and the Capture_odd signal 1612 can be re-aligned to the RxCLK signal 1602, for example, such that two or more of the symbols 1634, 1636, 1638, can be read in parallel.

Figure 17:
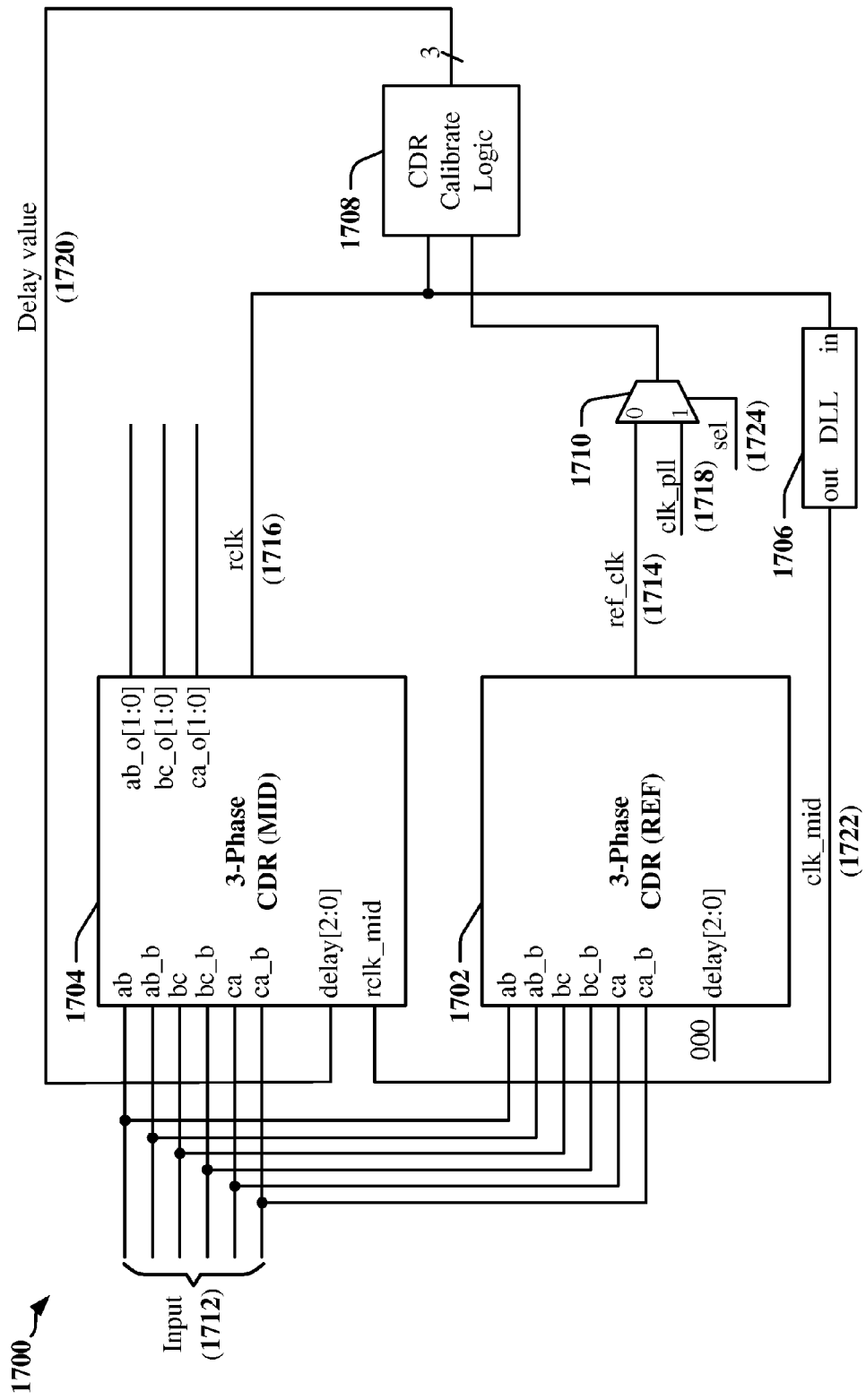
FIG. 17 illustrates an example of a clock generation circuit according to certain aspects disclosed herein.

FIG. 17 illustrates a circuit 1700 that can be used in accordance with the timing of FIG. 16 to reliably capture symbols transmitted on a 3-phase interface when the timing constraint $t_{skew} < t_{loop} < UI$ indicates that the reliability of clock recovery would otherwise be jeopardized. The circuit 1700 includes two CDR circuits 1702, 1704 and a DLL circuit 1706 that cooperate to produce a first clock (ref_clk) signal 1714 and a second clock signal (rclk) 1716 that can be used to capture symbols from an input 1712 that may include the difference signals 1202, 1204, 1206 and inverted versions of the difference signals 1202, 1204, 1206. The ref_clk signal 1714 is generated using a first 3-phase CDR circuit 1702. The ref_clk signal 1714 may be provided as a reference clock having a frequency of $F_{ref}$ corresponding to the symbol transmission frequency of the 3-phase interface. The rclk signal 1716 is generated using a second CDR circuit 1704. In various modes of operation, the frequency of the rclk signal 1716 may be a multiple of the frequency of the ref_elk signal 1714 (i.e. $2F_{ref}$, $1F_{ref}$, $0.5F_{ref}$, $\frac{1}{3}F_{ref}$, $0.25F_{ref}$, etc.). The first CDR circuit 1702 and the second CDR circuit 1704 may have similar architectures.

CDR calibration logic 1708 may be provided to detect differences in the frequency of the rclk signal 1716 relative to the frequency of the ref_clk signal 1714. One or more programmable delay elements in the second CDR circuit 1704 may be calibrated based on the difference in frequencies of the rclk signal 1716 and the ref_clk signal 1714. In one example, the CDR calibration logic 1708 may provide a multi-bit control signal. The multi-bit control signal may define that defines a delay parameter 1720 that controls the duration of delays produced by the programmable delay element in the second CDR circuit 1704. The programmable delay element may be configured using a parameter that is selected to cause the second CDR circuit 1704 to suppress pulse generation in some proportion of the UIs 1618, 1620. The rclk signal 1716 is provided to the DLL circuit 1706, which produces additional pulses in the form of a phase-shifted signal 1722 that, when combined with pulses in the rclk signal 1716, can be used by the second CDR circuit 1704 to generate the parallel output data (ab_o[1:0], bc_o [1:0], ca_o[1:0].

The programmed delay in the second CDR circuit 1704 may be configured by adjusting the programmed delay while monitoring the frequency of the rclk signal 1716. Initially, the programmed delay may set to produce a delay that persists for a time that is less than the UI time (the time required to transmit one symbol). In one example, the clock recovery circuit may be configured to produce the rclk signal 1716 with a frequency equal to the symbol transmission frequency when a 3-phase signal is initially received. The value of the programmed delay may then be incrementally increased until the frequency of the rclk signal 1716 is divided by 2, by 3, or by any desired factor.

Figure 18:
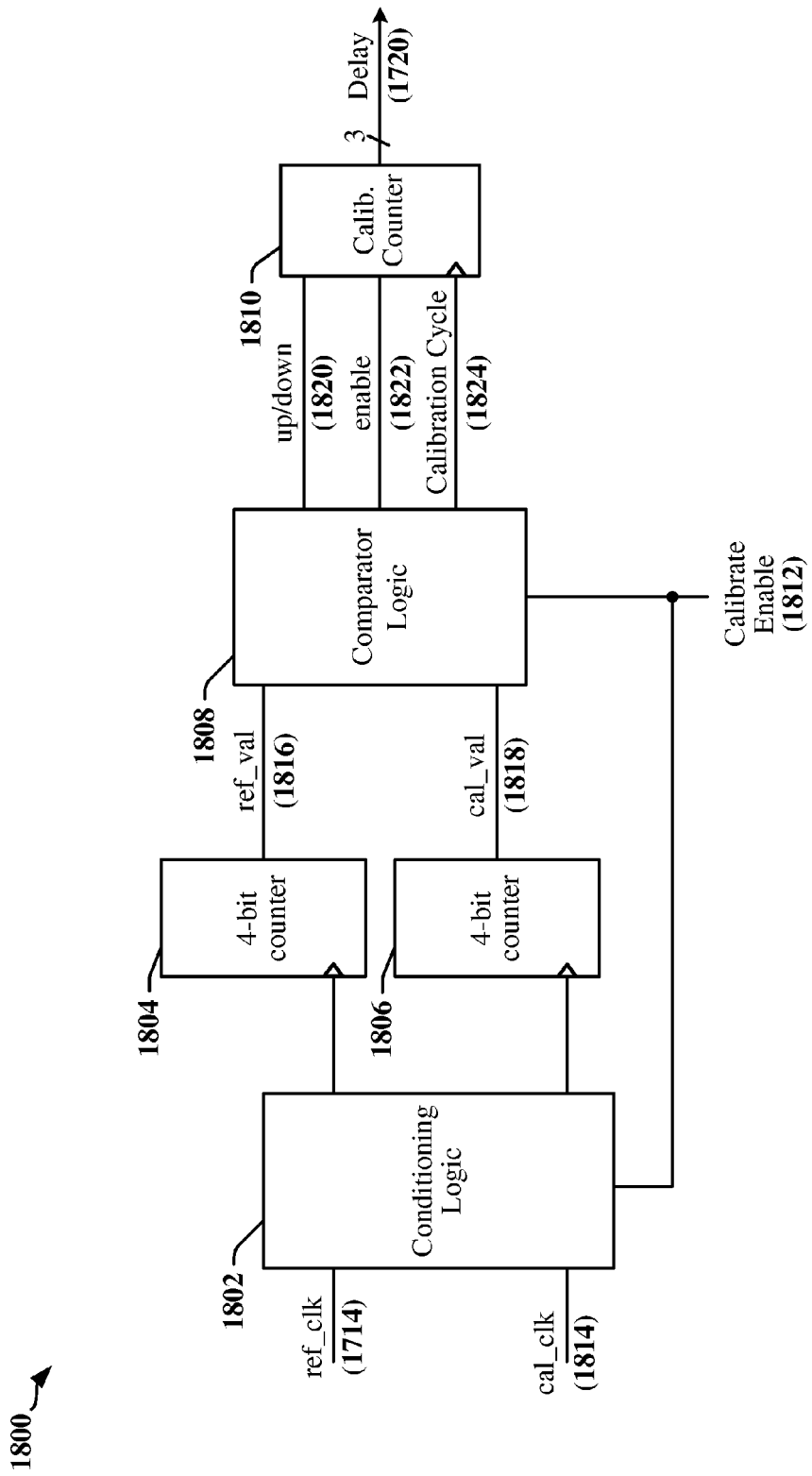
FIG. 18 illustrates one example of a circuit that may be used to calibrate a clock generation circuit provided in accordance with certain aspects disclosed herein.

FIG. 18 illustrates one example of a CDR calibration circuit 1800 used to configure the delay element of the second CDR circuit 1704. The CDR calibration circuit 1800 may be enabled by a signal 1812, which may be provided by a processing circuit. The CDR calibration circuit 1800 may include conditioning logic 1802 that is used to drive, and/or adjust timing of the ref_clk signal 1714 and a calibration clock (cal_clk) signal 1816. In one example, the ref_clk signal 1714 may be derived from a reference CDR circuit (e.g., the CDR circuit 1702), a free-running oscillator, a phase-locked loop, or other clock generation circuit. The CDR calibration circuit 1800 may include counters 1804 and 1806 that are clocked by conditioned versions of the ref_clk signal 1714 and the cal_clk signal 1816. The output of the counters 1804 and 1806 may be monitored by comparator logic 1808, which may determine the frequency of the ref_clk signal 1714 relative to the cal_clk signal 1816. A calibration counter 1810 may be adjusted during successive calibration cycles to control one or more programmable delay elements in a CDR circuit (e.g. the second CDR circuit 1704). The calibration counter 1810 may, for example, be incremented or decremented after each calibration cycle depending on a determination made by the comparator logic 1808. The comparator logic 1808 may control the calibration counter 1810 using one or more of an up/down signal 1818, an enable counter signal 1820, and a calibration cycle clock signal 1822.

Clock frequencies may be measured using the counters 1804, 1806. The counters 1804, 1806 may be incremented by the ref elk signal 1714 and the cal_clk signal 1816 for a predetermined time period, which may be determined by the calibration cycle clock signal 1824 for example. A first counter 1804 may capture the number of clock cycles (ref_val) 1814 corresponding to the ref_clk signal 1714. In some instances, the first counter may be operated immediately after initialization to capture a ref_val 1814 that is a measure of the full-rate symbol transmission clock, and in some instances this initially-obtained ref_val 1814 may be registered or otherwise captured to be used for subsequent calibration cycles. A second counter 1804 counts the number of clock cycles (cal_val) 1818 that occur during a calibration cycle. The calibration cycle may be configured as a predetermined time period or may be an adjustable time period. For each calibration cycle, a delay parameter 1720 is provided to the CDR 1704 under calibration, and the frequency of the resultant cal_clk signal 1814 may be measured as the cal_val 1818 accumulated by the second counter 1806 during the calibration cycle. When the cal_val 1818 reflects a value that is a division of the clock frequency by the desired factor, the configuration is complete and the final value of the delay parameter 1720 may be used to operate the clock recovery circuit.

The second CDR circuit 1704 may be calibrated by incrementing or decrementing the delay parameter 1720 until a desired frequency for the cal_clk signal 1814. Changes in frequency may result in changes in cal_val 1818 and the comparator logic 1808 may continue calibration until a predefined difference between cal_val 1818 and ref_val 1816 is obtained. Calibration may commence with a low value for the delay parameter 1720 and the delay parameter 1720 may then be incremented for each calibration cycle. Calibration may commence with a high value for the delay parameter 1720 and the delay parameter 1720 may then be decremented for each calibration cycle.

According to certain aspects, a receiver may determine the nominal symbol transmission frequency of the C-PHY interface by adjusting delay elements of a CDR circuit until a training sequence is accurately received. A transmitter may send the training sequence during link initialization, prior to transmitting individual packets of data, after detection of an error at the receiver, and/or under application or system control. The receiver may monitor the C-PHY interface for activity, and may perform calibration upon detection of transitions. In some instances, the receiver may determine that the CDR circuit has already been calibrated and may perform calibration if the training sequence is not properly received.

In the example illustrated in FIG. 12, calibration commences when the programmable delay 1214 is initialized to a predetermined value that enables the CDR circuit 1200 to detect the training sequence. The CDR circuit 1200 may be adapted according to certain aspects disclosed herein such that the programmable delay 1214 may be adjusted to increase the $t_{loop}$ duration 1604 until errors are detected in the training sequence. The CDR circuit 1200 may be configured for normal operation with a programmable delay 1214 with a value that is one or more increments lower than the value that caused errors to be detected in the training sequence.

Figure 19:
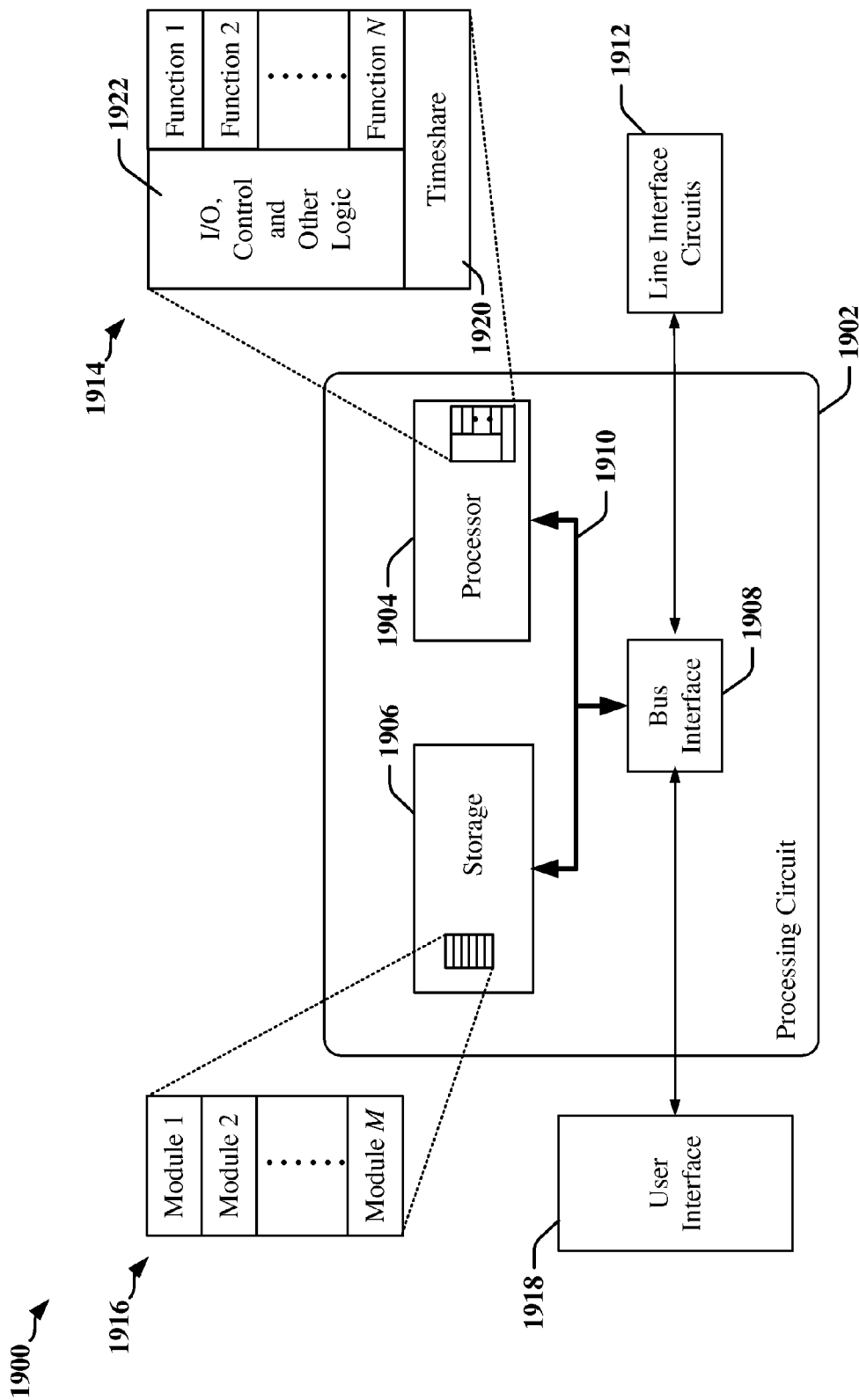
FIG. 19 is a block diagram illustrating an example of an apparatus employing a processing circuit that may be adapted according to certain aspects disclosed herein.

FIG. 19 is a conceptual diagram 1900 illustrating an example of a hardware implementation for an apparatus employing a processing circuit 1902 that may be configured to perform one or more functions disclosed herein. In accordance with various aspects of the disclosure, an element, or any portion of an element, or any combination of elements as disclosed herein may be implemented using the processing circuit 1902. The processing circuit 1902 may include one or more processors 1904 that are controlled by some combination of hardware and software modules. Examples of processors 1904 include microprocessors, microcontrollers, digital signal processors (DSPs), field programmable gate arrays (FPGAs), programmable logic devices (PLDs), state machines, sequencers, gated logic, discrete hardware circuits, and other suitable hardware configured to perform the various functionality described throughout this disclosure. The one or more processors 1904 may include specialized processors that perform specific functions, and that may be configured, augmented or controlled by one of the software modules 1916. The one or more processors 1904 may be configured through a combination of software modules 1916 loaded during initialization, and further configured by loading or unloading one or more software modules 1916 during operation.

In the illustrated example, the processing circuit 1902 may be implemented with a bus architecture, represented generally by the bus 1910. The bus 1910 may include any number of interconnecting buses and bridges depending on the specific application of the processing circuit 1902 and the overall design constraints. The bus 1910 links together various circuits including the one or more processors 1904, and storage 1906. Storage 1906 may include memory devices and mass storage devices, and may be referred to herein as computer-readable media and/or processor-readable media. The bus 1910 may also link various other circuits such as timing sources, timers, peripherals, voltage regulators, and power management circuits. A bus interface 1908 may provide an interface between the bus 1910 and one or more transceivers 1912. A transceiver 1912 may be provided for each networking technology supported by the processing circuit. In some instances, multiple networking technologies may share some or all of the circuitry or processing modules found in a transceiver 1912. Each transceiver 1912 provides a means for communicating with various other apparatus over a transmission medium. Depending upon the nature of the apparatus, a user interface 1918 (e.g., keypad, display, speaker, microphone, joystick) may also be provided, and may be communicatively coupled to the bus 1910 directly or through the bus interface 1908.

A processor 1904 may be responsible for managing the bus 1910 and for general processing that may include the execution of software stored in a computer-readable medium that may include the storage 1906. In this respect, the processing circuit 1902, including the processor 1904, may be used to implement any of the methods, functions and techniques disclosed herein. The storage 1906 may be used for storing data that is manipulated by the processor 1904 when executing software, and the software may be configured to implement any one of the methods disclosed herein.

One or more processors 1904 in the processing circuit 1902 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 1906 or in an external computer readable medium. The external computer-readable medium and/or storage 1906 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), a random access memory (RAM), a ROM, a PROM, an erasable PROM (EPROM), an EEPROM, a register, a removable disk, and any other suitable medium for storing software and/or instructions that may be accessed and read by a computer. The computer-readable medium and/or storage 1906 may also include, by way of example, a carrier wave, a transmission line, and any other suitable medium for transmitting software and/or instructions that may be accessed and read by a computer. Computer-readable medium and/or the storage 1906 may reside in the processing circuit 1902, in the processor 1904, external to the processing circuit 1902, or be distributed across multiple entities including the processing circuit 1902. The computer-readable medium and/or storage 1906 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 1906 may maintain software maintained and/or organized in loadable code segments, modules, applications, programs, etc., which may be referred to herein as software modules 1916. Each of the software modules 1916 may include instructions and data that, when installed or loaded on the processing circuit 1902 and executed by the one or more processors 1904, contribute to a run-time image 1914 that controls the operation of the one or more processors 1904. When executed, certain instructions may cause the processing circuit 1902 to perform functions in accordance with certain methods, algorithms and processes described herein.

Some of the software modules 1916 may be loaded during initialization of the processing circuit 1902, and these software modules 1916 may configure the processing circuit 1902 to enable performance of the various functions disclosed herein. For example, some software modules 1916 may configure internal devices and/or logic circuits 1922 of the processor 1904, and may manage access to external devices such as the transceiver 1912, the bus interface 1908, the user interface 1918, timers, mathematical coprocessors, and so on. The software modules 1916 may include a control program and/or an operating system that interacts with interrupt handlers and device drivers, and that controls access to various resources provided by the processing circuit 1902. The resources may include memory, processing time, access to the transceiver 1912, the user interface 1918, and so on.

One or more processors 1904 of the processing circuit 1902 may be multifunctional, whereby some of the software modules 1916 are loaded and configured to perform different functions or different instances of the same function. The one or more processors 1904 may additionally be adapted to manage background tasks initiated in response to inputs from the user interface 1918, the transceiver 1912, and device drivers, for example. To support the performance of multiple functions, the one or more processors 1904 may be configured to provide a multitasking environment, whereby each of a plurality of functions is implemented as a set of tasks serviced by the one or more processors 1904 as needed or desired. In one example, the multitasking environment may be implemented using a timesharing program 1920 that passes control of a processor 1904 between different tasks, whereby each task returns control of the one or more processors 1904 to the timesharing program 1920 upon completion of any outstanding operations and/or in response to an input such as an interrupt. When a task has control of the one or more processors 1904, the processing circuit is effectively specialized for the purposes addressed by the function associated with the controlling task. The timesharing program 1920 may include an operating system, a main loop that transfers control on a round-robin basis, a function that allocates control of the one or more processors 1904 in accordance with a prioritization of the functions, and/or an interrupt driven main loop that responds to external events by providing control of the one or more processors 1904 to a handling function.

Figure 20:
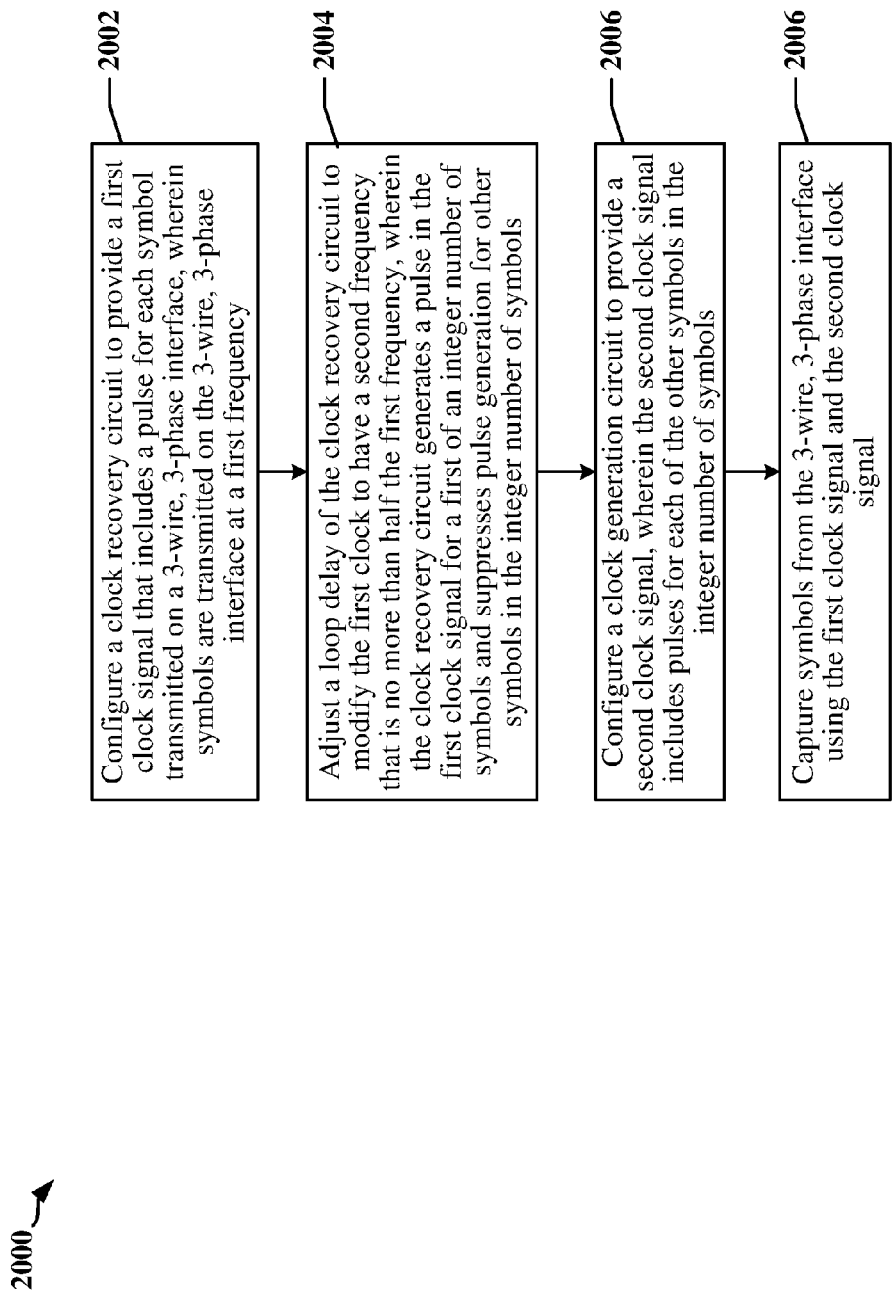
FIG. 20 is a flow chart of a method of clock generation according to certain aspects disclosed herein.

FIG. 20 is a flow chart 2000 of a method of data communication that may be performed by a receiver circuit in an apparatus coupled to a C-PHY 3-Phase interface.

At block 2002, the receiver circuit may configure a clock recovery circuit to provide a first clock signal that includes a pulse for each symbol transmitted on a 3-wire, 3-phase interface. Symbols may be transmitted on the 3-wire, 3-phase interface at a first frequency.

At block 2004, the receiver circuit may adjust a loop delay of the clock recovery circuit to modify the first clock to have a second frequency that is no more than half the first frequency. The clock recovery circuit may generate a pulse in the first clock signal for a first of an integer number of symbols and may suppress pulse generation for other symbols in the integer number of symbols. The loop delay may correspond to a pulse generation cycle used to generate a pulse in response to a first-detected transition in signaling state of the 3-wire, 3-phase interface. Detection of other transitions in signaling state of the 3-wire, 3-phase interface may be suppressed during the pulse generation cycle. The receiver circuit may adjust the loop delay by configuring one or more programmable delay circuits in the clock recovery circuit.

At block 2006, the receiver circuit may configure a clock generation circuit to provide a second clock signal. The second clock signal may include pulses corresponding to each of the other symbols in the integer number of symbols.

At block 2008, the receiver circuit may capture symbols from the 3-wire, 3-phase interface using the first clock signal and the second clock signal. In the example, the first clock signal may be combined with the second clock signal to produce a receive clock signal. The receive clock symbol may be used to clock registers that capture the signals.

In one example, the first frequency may be twice the second frequency and the second clock signal may include one pulse for every pulse in the first clock signal. In this example, the second frequency is 180 degrees phase-shifted with respect to the first clock signal. In another example, the second frequency is one-third of the first frequency, and the second clock signal may include two pulses for every pulse in the first clock signal. In another example, the second frequency is one-fourth of the first frequency, and the second clock signal may include three pulses for every pulse in the first clock signal. Other divisor values may be employed to derive the second frequency.

In some instances, adjusting the loop delay of the clock recovery circuit includes configuring a first circuit to recover a reference clock signal from a stream of symbols received from the 3-wire, 3-phase interface, determining a current frequency of the first clock signal by comparing frequencies of the reference clock signal and the first clock signal during each of a plurality of calibration cycles, increasing the loop delay when the current frequency is determined to be greater than the second frequency, decreasing the loop delay when the current frequency is determined to be less than the second frequency, and terminating the plurality of calibration cycles when the current frequency is determined to be equal to the second frequency. The reference clock signal may have a frequency corresponding to the first frequency.

Figure 21:
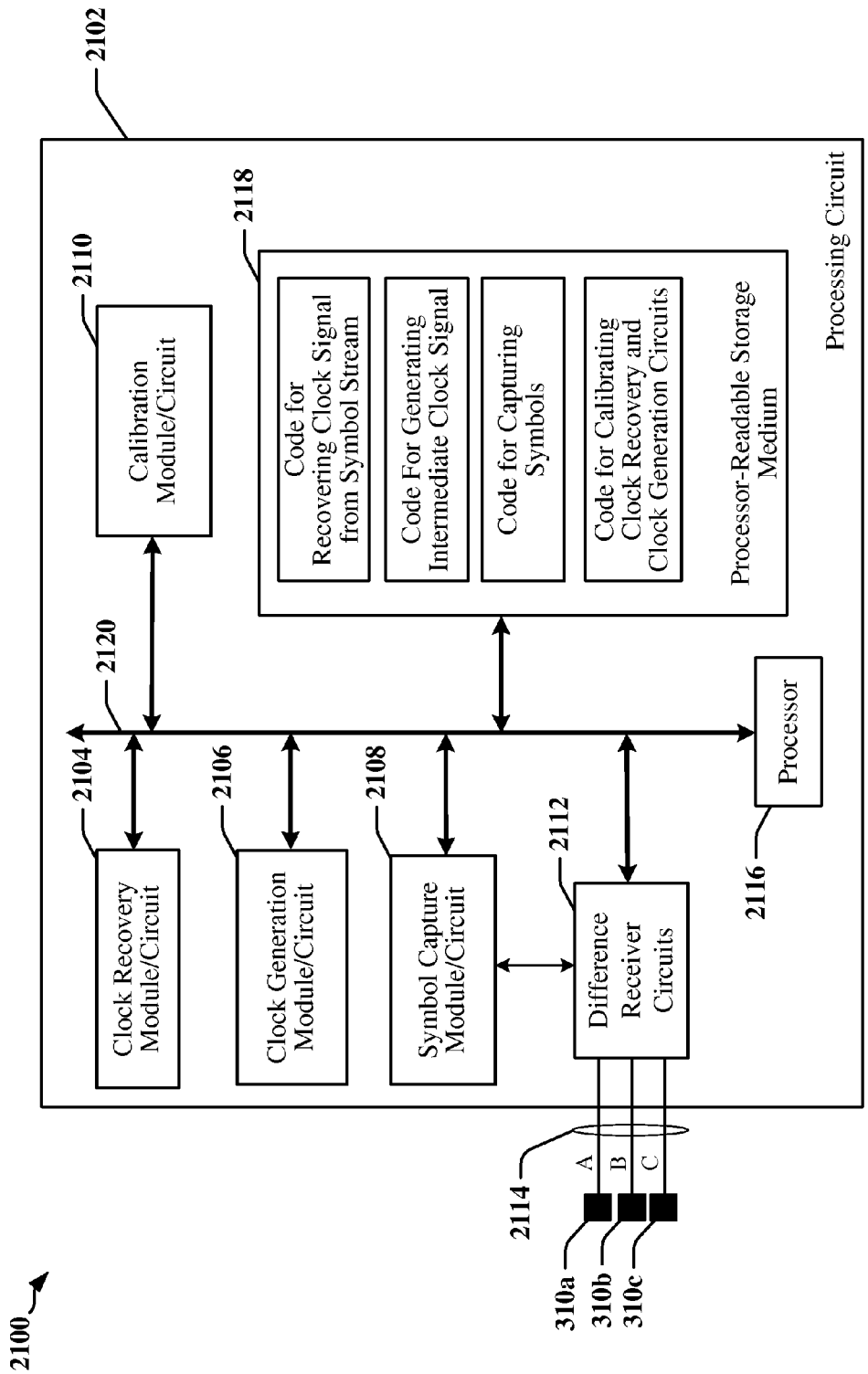
FIG. 21 is a diagram illustrating an example of a hardware implementation for an apparatus employing a processing employing a processing circuit adapted according to certain aspects disclosed herein.

FIG. 21 is a diagram illustrating an example of a hardware implementation for an apparatus 2100 employing a processing circuit 2102. The processing circuit typically has a processor 2116 that may include one or more of a microprocessor, microcontroller, digital signal processor, a sequencer and a state machine. The processing circuit 2102 may be implemented with a bus architecture, represented generally by the bus 2120. The bus 2120 may include any number of interconnecting buses and bridges depending on the specific application of the processing circuit 2102 and the overall design constraints. The bus 2120 links together various circuits including one or more processors and/or hardware modules, represented by the processor 2116, the modules or circuits 2104, 2106, 2108 and 2110, difference receiver circuits 2112 that determine difference signaling state between different pairs of the connectors or wires 2114 and the computer-readable storage medium 2118. The bus 2120 may also link various other circuits such as timing sources, peripherals, voltage regulators, and power management circuits, which are well known in the art, and therefore, will not be described any further.

The processor 2116 is responsible for general processing, including the execution of software stored on the computer-readable storage medium 2118. The software, when executed by the processor 2116, causes the processing circuit 2102 to perform the various functions described supra for any particular apparatus. The computer-readable storage medium 2118 may also be used for storing data that is manipulated by the processor 2116 when executing software, including data decoded from symbols transmitted over the connectors or wires 2114, which may be configured as data lanes and clock lanes. The processing circuit 2102 further includes at least one of the modules 2104, 2106, 2108 and 2110. The modules 2104, 2106, 2108 and 2110 may be software modules running in the processor 2116, resident/stored in the computer-readable storage medium 2118, one or more hardware modules coupled to the processor 2116, or some combination thereof. The modules 2104, 2106, 2108 and/or 2110 may include microcontroller instructions, state machine configuration parameters, or some combination thereof.

In one configuration, the apparatus 2100 may be configured for data communication over a C-PHY 3-phase interface. The apparatus 2100 may include a module and/or circuit 2104 that is configured to recover a first clock signal from timing information embedded in sequences of symbols transmitted on the connectors or wires 2114, a module and/or circuit 2106 for generating a second clock signal that include pluses interpolated from the first clock signal, a module and/or circuit 2108 that uses the first and second signals to capture symbols from the connectors or wires 2114, and a module and/or circuit 2110 that can calibrate the clock recovery module and/or circuit 2104 and the clock generation module and/or circuit 2106.

The apparatus 2100 may be configured for various modes of operation. In one example, the clock recovery module and/or circuit 2104 may be adapted to provide a first clock signal that includes a pulse for each symbol transmitted at a first frequency on a 3-wire, 3-phase interface, the calibration module and/or circuit 2110 may be adapted to calibrate a loop delay of the clock recovery circuit, the clock generation module and/or circuit 2106 may be adapted to provide a second clock signal, and the symbol capture module and/or circuit 2108 may be adapted to capture symbols from the 3-wire, 3-phase interface using the first clock signal and the second clock signal. In one mode of operation, the calibration module and/or circuit 2110 modifies the first clock signal to have a second frequency that is no more than half the first frequency. In the first mode of operation, the clock recovery module and/or circuit 2104 generates a pulse in the first clock signal for a first of an integer number of symbols and suppresses pulse generation for other symbols in the integer number of symbols. The second clock signal may include pulses corresponding to each of the other symbols in the integer number of symbols.

In some instances, the loop delay corresponds to a pulse generation cycle used to generate a pulse in response to a first-detected transition in signaling state of the 3-wire, 3-phase interface. Detection of other transitions in signaling state of the 3-wire, 3-phase interface may be suppressed during the pulse generation cycle. The calibration module and/or circuit 2110 may be configured to program a programmable delay circuit.

In one example, the first frequency is twice the second frequency, and the second clock signal includes one pulse for every pulse in the first clock signal. The second clock signal may be 180 degrees phase-shifted with respect to the first clock signal. In another example, the second frequency is one-third of the first frequency, and the second clock signal includes two pulses for every pulse in the first clock signal. In another example, the second frequency is one-fourth of the first frequency, and the second clock signal includes three pulses for every pulse in the first clock signal.

In some instances, the calibration module and/or circuit 2110 is adapted to cause a first circuit to recover a reference clock signal from a stream of symbols received from the 3-wire, 3-phase interface, determine a current frequency of the first clock signal by comparing frequencies of the reference clock signal and the first clock signal during each of a plurality of calibration cycles, increase the loop delay when the current frequency is determined to be greater than the second frequency, decrease the loop delay when the current frequency is determined to be less than the second frequency, and terminate the plurality of calibration cycles when the current frequency is determined to be equal to the second frequency. The reference clock signal may have a frequency corresponding to a rate of transmission of the stream of symbols.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method of data communications, comprising:
configuring a clock recovery circuit to provide a first clock signal that includes pulses corresponding to symbols transmitted on a 3-wire, 3-phase interface, wherein symbols are transmitted on the 3-wire, 3-phase interface at a first frequency;
adjusting a loop delay of the clock recovery circuit to modify the first clock to have a second frequency that is no more than half the first frequency, wherein the clock recovery circuit generates a pulse in the first clock signal for a first of an integer number of symbols and suppresses pulse generation for other symbols in the integer number of symbols;
configuring a clock generation circuit to provide a second clock signal, wherein the second clock signal includes pulses for each of the other symbols in the integer number of symbols; and
capturing symbols from the 3-wire, 3-phase interface using the first clock signal and the second clock signal,
wherein the loop delay corresponds to a pulse generation cycle used to generate a pulse in response to a first-detected transition in signaling state of the 3-wire, 3-phase interface, and
wherein detection of other transitions in signaling state of the 3-wire, 3-phase interface is suppressed during the pulse generation cycle.

2. The method of claim 1, wherein adjusting the loop delay comprises:
configuring a programmable delay circuit.

3. The method of claim 1, wherein the first frequency is twice the second frequency, and wherein the second clock signal includes one pulse for every pulse in the first clock signal.

4. The method of claim 3, wherein the second clock signal is 180 degrees phase-shifted with respect to the first clock signal.

5. The method of claim 1, wherein the second frequency is one-third of the first frequency, and wherein the second clock signal includes two pulses for every pulse in the first clock signal.

6. The method of claim 1, wherein the second frequency is one-fourth of the first frequency, and wherein the second clock signal includes three pulses for every pulse in the first clock signal.

7. The method of claim 1, wherein adjusting the loop delay of the clock recovery circuit includes:
configuring a first circuit to recover a reference clock signal from a stream of symbols received from the 3-wire, 3-phase interface, wherein the reference clock signal has a frequency corresponding to the first frequency;
determining a current frequency of the first clock signal by comparing frequencies of the reference clock signal and the first clock signal during each of a plurality of calibration cycles;
increasing the loop delay when the current frequency is determined to be greater than the second frequency;
decreasing the loop delay when the current frequency is determined to be less than the second frequency; and
terminating the plurality of calibration cycles when the current frequency is determined to be equal to the second frequency.

8. An apparatus for decoding data transmitted on a 3-wire 3-phase interface, comprising:
means for configuring a clock recovery circuit to provide a first clock signal that includes pulses corresponding to symbols transmitted at a first frequency on a 3-wire, 3-phase interface;
means for calibrating a loop delay of the clock recovery circuit, wherein in one mode of operation, the means for calibrating the loop delay modifies the first clock signal to have a second frequency that is no more than half the first frequency, wherein the clock recovery circuit generates a pulse in the first clock signal for a first of an integer number of symbols and suppresses pulse generation for other symbols in the integer number of symbols;
means for configuring a clock generation circuit to provide a second clock signal, wherein the second clock signal includes pulses for each of the other symbols in the integer number of symbols; and
means for capturing symbols from the 3-wire, 3-phase interface using the first clock signal and the second clock signal,
wherein the loop delay corresponds to a pulse generation cycle used to generate a pulse in response to a first-detected transition in signaling state of the 3-wire, 3-phase interface, and
wherein detection of other transitions in signaling state of the 3-wire, 3-phase interface is suppressed during the pulse generation cycle.

9. The apparatus of claim 8, wherein the means for calibrating the loop delay is configured to:
program a programmable delay circuit.

10. The apparatus of claim 8, wherein the first frequency is twice the second frequency, and wherein the second clock signal includes one pulse for every pulse in the first clock signal, and wherein the second frequency is 180 degrees phase-shifted with respect to the first clock signal.

11. The apparatus of claim 8, wherein the second frequency is one-third of the first frequency, and wherein the second clock signal includes two pulses for every pulse in the first clock signal.

12. The apparatus of claim 8, wherein the second frequency is one-fourth of the first frequency, and wherein the second clock signal includes three pulses for every pulse in the first clock signal.

13. The apparatus of claim 8, wherein the means for calibrating the loop delay of the clock recovery circuit is configured to:
cause a first circuit to recover a reference clock signal from a stream of symbols received from the 3-wire, 3-phase interface, wherein the reference clock signal has a frequency corresponding to a rate of transmission of the stream of symbols;
determine a current frequency of the first clock signal by comparing frequencies of the reference clock signal and the first clock signal during each of a plurality of calibration cycles;
increase the loop delay when the current frequency is determined to be greater than the second frequency;
decrease the loop delay when the current frequency is determined to be less than the second frequency; and
terminate the plurality of calibration cycles when the current frequency is determined to be equal to the second frequency.

14. An apparatus for data communication, comprising:
a plurality of difference receivers coupled to a 3-wire bus;
a clock recovery circuit configured to provide a first clock signal that includes pulses corresponding to symbols transmitted in a stream of symbols at a first frequency on a 3-wire, 3-phase interface; and
a processing circuit configured to:
adjust a loop delay of the clock recovery circuit until the first clock is modified to have a second frequency that is no more than half the first frequency, wherein the clock recovery circuit generates a pulse in the first clock signal for a first of an integer number of symbols in the stream of symbols and suppresses pulse generation for other symbols in the integer number of the stream of symbols; and
configure a clock generation circuit to provide a second clock signal, wherein the second clock signal includes pulses for each of the other symbols in the integer number of symbols; and
one or more registers that capture symbols from the 3-wire, 3-phase interface in response to pulses in the first clock signal and the second clock signal,
wherein the loop delay corresponds to a pulse generation cycle used to generate a pulse in response to a first-detected transition in signaling state of the 3-wire, 3-phase interface, and
wherein detection of other transitions in signaling state of the 3-wire, 3-phase interface is suppressed during the pulse generation cycle.

15. The apparatus of claim 14, wherein the processing circuit adjusts the loop delay of the clock recovery circuit by configuring a programmable delay circuit.

16. The apparatus of claim 14, wherein the first frequency is twice the second frequency, and wherein the second clock signal includes one pulse for every pulse in the first clock signal.

17. The apparatus of claim 14, wherein the second frequency is one-third of the first frequency, and wherein the second clock signal includes two pulses for every pulse in the first clock signal.

18. The apparatus of claim 14, wherein the second frequency is one-fourth of the first frequency, and wherein the second clock signal includes three pulses for every pulse in the first clock signal.

19. The apparatus of claim 14, wherein the processing circuit adjusts the loop delay of the clock recovery circuit by:
configuring a first circuit to recover a reference clock signal from a stream of symbols received from the 3-wire, 3-phase interface, wherein the reference clock signal has a frequency corresponding to a rate of transmission of the stream of symbols;
determining a current frequency of the first clock signal by comparing frequencies of the reference clock signal and the first clock signal during each of a plurality of calibration cycles;
increasing the loop delay when the current frequency is determined to be greater than the second frequency;
decreasing the loop delay when the current frequency is determined to be less than the second frequency; and
terminating the plurality of calibration cycles when the current frequency is determined to be equal to the second frequency.

20. A processor readable storage medium, comprising code for:
configuring a clock recovery circuit to provide a first clock signal that includes pulses corresponding to symbols transmitted on a 3-wire, 3-phase interface, wherein symbols are transmitted on the 3-wire, 3-phase interface at a first frequency;
adjusting a loop delay of the clock recovery circuit such that the first clock has a second frequency that is no more than half the first frequency, wherein the clock recovery circuit generates a pulse in the first clock signal for a first of an integer number of symbols and suppresses pulse generation for other symbols in the integer number of symbols;
configuring a clock generation circuit to provide a second clock signal, wherein the second clock signal includes pulses for each of the other symbols in the integer number of symbols; and
capturing symbols from the 3-wire, 3-phase interface using the first clock signal and the second clock signal,
wherein the loop delay corresponds to a pulse generation cycle used to generate a pulse in response to a first-detected transition in signaling state of the 3-wire, 3-phase interface, and
wherein detection of other transitions in signaling state of the 3-wire, 3-phase interface is suppressed during the pulse generation cycle.

21. The storage medium of claim 20, wherein adjusting the loop delay includes configuring a programmable delay circuit.

22. The storage medium of claim 20, wherein the first frequency is twice the second frequency, and wherein the second clock signal includes one pulse for every pulse in the first clock signal, wherein the second clock signal is 180 degrees phase-shifted with respect to the first clock signal.

23. The storage medium of claim 20, wherein the second frequency is one-third of the first frequency, and wherein the second clock signal includes two pulses for every pulse in the first clock signal.

24. The storage medium of claim 20, wherein the second frequency is one-fourth of the first frequency, and wherein the second clock signal includes three pulses for every pulse in the first clock signal.

25. The storage medium of claim 20, wherein adjusting the loop delay of the clock recovery circuit includes:
configuring a first circuit to recover a reference clock signal from a stream of symbols received from the 3-wire, 3-phase interface, wherein the reference clock signal has a frequency corresponding to a rate of transmission of the stream of symbols;
determining a current frequency of the first clock signal by comparing frequencies of the reference clock signal and the first clock signal during each of a plurality of calibration cycles;
increasing the loop delay when the current frequency is determined to be greater than the second frequency;
decreasing the loop delay when the current frequency is determined to be less than the second frequency; and
terminating the plurality of calibration cycles when the current frequency is determined to be equal to the second frequency.

* * * * *